(12) United States Patent  (10) Patent No.: US 7,443,726 B2
Guterman  (45) Date of Patent: *Oct. 28, 2008

(54) SYSTEMS FOR ALTERNATE ROW-BASED READING AND WRITING FOR NON-VOLATILE MEMORY

(75) Inventor: Daniel C. Guterman, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 149 days.

This patent is subject to a terminal disclaimer.

(21) Appl. No.: 11/321,346

(22) Filed: Dec. 29, 2005

(65) Prior Publication Data

US 2007/0153577 A1    Jul. 5, 2007

(51) Int. Cl.
*G11C 16/04*    (2006.01)

(52) U.S. Cl. .............................. 365/185.05; 365/185.03; 365/185.01; 365/185.02; 365/185.17

(58) Field of Classification Search ............ 365/185.05, 365/185.03, 185.01, 185.02, 185.17
See application file for complete search history.

(56) References Cited

U.S. PATENT DOCUMENTS

| | | | |
|---|---|---|---|
| 5,101,378 | A | 3/1992 | Radjy et al. |
| 5,449,947 | A | 9/1995 | Chen et al. |
| 5,532,962 | A | 7/1996 | Auclair et al. |
| 5,570,315 | A | 10/1996 | Tanaka et al. |
| 5,581,504 | A | 12/1996 | Chang |
| 5,764,572 | A | 6/1998 | Hammick |
| 5,774,397 | A | 6/1998 | Endoh et al. |
| 5,812,457 | A | 9/1998 | Arase |
| 5,814,853 | A | 9/1998 | Chen |

(Continued)

FOREIGN PATENT DOCUMENTS

EP    01271553    1/2003

(Continued)

OTHER PUBLICATIONS

Notice of Allowance and Fee(s) Due, United States Patent & Tradmark Office, U.S. Appl. No. 11/321,259, filed Dec. 29, 2005, Sep. 17, 2007.

(Continued)

*Primary Examiner*—Connie C Yoha
(74) *Attorney, Agent, or Firm*—Vierra Magen Marcus & DeNiro LLP

(57) ABSTRACT

A set of storage elements is programmed beginning with a word line WLn adjacent a select gate line for the set. After programming the first word line, the next word line WLn+1 adjacent to the first word line is skipped and the next word line WLn+2 adjacent to WLn+1 is programmed. WLn+1 is then programmed. Programming continues according to the sequence {WLn+4, WLn+3, WLn+6, WLn+5, . . . } until all but the last word line for the set have been programmed. The last word line is then programmed. By programming in this manner, some of the word lines of the set (WLn+1, WLn+3, etc.) have no subsequently programmed neighboring word lines. The memory cells of these word lines will not experience any floating gate to floating gate coupling threshold voltage shift impact due to subsequently programmed neighboring memory cells. The word lines having no subsequently programmed neighbors are read without using offsets or compensations based on neighboring memory cells. The other word lines are read using compensations based on data states within both subsequently programmed neighboring word lines.

31 Claims, 18 Drawing Sheets

U.S. PATENT DOCUMENTS

| | | | |
|---|---|---|---|
| 5,867,429 | A | 2/1999 | Chen et al. |
| 5,898,615 | A | 4/1999 | Chida |
| 5,917,766 | A | 6/1999 | Tsuji et al. |
| 5,943,257 | A | 8/1999 | Jeon et al. |
| 6,046,935 | A | 4/2000 | Takeuchi et al. |
| 6,061,280 | A | 5/2000 | Aritome |
| 6,154,391 | A | 11/2000 | Takeuchi et al. |
| 6,175,522 | B1 | 1/2001 | Fang |
| 6,222,762 | B1 | 4/2001 | Guterman et al. |
| 6,240,016 | B1 | 5/2001 | Haddad et al. |
| 6,259,632 | B1 | 7/2001 | Khouri et al. |
| 6,266,279 | B1 | 7/2001 | Yoshimura |
| 6,377,507 | B1 | 4/2002 | Tsao |
| 6,380,033 | B1 | 4/2002 | He et al. |
| 6,456,528 | B1 | 9/2002 | Chen |
| 6,522,580 | B2 | 2/2003 | Chen et al. |
| 6,535,423 | B2 | 3/2003 | Trivedi et al. |
| 6,542,407 | B1 | 4/2003 | Chen et al. |
| 6,570,785 | B1 | 5/2003 | Mangan et al. |
| 6,570,790 | B1 | 5/2003 | Harari |
| 6,594,181 | B1 | 7/2003 | Yamada |
| 6,643,188 | B2 | 11/2003 | Tanaka et al. |
| 6,657,891 | B1 | 12/2003 | Shibata et al. |
| 6,707,714 | B2 | 3/2004 | Kawamura |
| 6,717,847 | B2 | 4/2004 | Chen |
| 6,771,536 | B2 | 8/2004 | Li et al. |
| 6,781,877 | B2 | 8/2004 | Cernea et al. |
| 6,785,169 | B1 | 8/2004 | Nemati et al. |
| 6,798,698 | B2 | 9/2004 | Tanaka et al. |
| 6,807,095 | B2 | 10/2004 | Chen et al. |
| 6,870,766 | B2 | 3/2005 | Cho et al. |
| 6,870,768 | B2 | 3/2005 | Cernea et al. |
| 6,888,758 | B1 | 5/2005 | Hemink et al. |
| 6,891,262 | B2 | 5/2005 | Nomoto et al. |
| 6,956,770 | B2 | 10/2005 | Khalid et al. |
| 6,987,694 | B2 * | 1/2006 | Lee ........................ 365/185.17 |
| 7,012,835 | B2 | 3/2006 | Gonzalez et al. |
| 7,020,017 | B2 | 3/2006 | Chen et al. |
| 7,031,214 | B2 | 4/2006 | Tran |
| 7,057,936 | B2 | 6/2006 | Yaegashi et al. |
| 7,099,194 | B2 | 8/2006 | Tu et al. |
| 7,177,977 | B2 | 2/2007 | Chen et al. |
| 2003/0025147 | A1 | 2/2003 | Nomoto et al. |
| 2003/0053334 | A1 | 3/2003 | Chen |
| 2003/0137888 | A1 | 7/2003 | Chen et al. |
| 2003/0161182 | A1 | 8/2003 | Li et al. |
| 2004/0047182 | A1 | 3/2004 | Cernea et al. |
| 2004/0057283 | A1 | 3/2004 | Cernea |
| 2004/0057285 | A1 | 3/2004 | Cernea et al. |
| 2004/0057287 | A1 | 3/2004 | Cernea et al. |
| 2004/0057318 | A1 | 3/2004 | Cernea et al. |
| 2004/0060031 | A1 | 3/2004 | Cernea |
| 2004/0109357 | A1 | 6/2004 | Cernea et al. |
| 2004/0213031 | A1 | 10/2004 | Hosono |
| 2005/0018484 | A1 | 1/2005 | Sakuma |
| 2005/0117401 | A1 | 6/2005 | Chen |
| 2005/0174852 | A1 | 8/2005 | Hemink |
| 2006/0221683 | A1 | 10/2006 | Chen et al. |
| 2006/0221692 | A1 | 10/2006 | Chen |
| 2006/0221714 | A1 | 10/2006 | Li et al. |
| 2007/0153583 | A1 * | 7/2007 | Guterman ............... 365/185.23 |
| 2007/0242522 | A1 * | 10/2007 | Hemink ................. 365/185.24 |

FOREIGN PATENT DOCUMENTS

| | | |
|---|---|---|
| EP | 01329898 | 1/2003 |
| EP | 1172822 | 3/2007 |

OTHER PUBLICATIONS

Allowed Claims, U.S. Appl. No. 11/321,259, filed Dec. 29, 2005.

International Search Report & The Written Opinion of the International Searching Authority, Patent Cooperation Treaty, Application No. PCT/US2006/049381 entitled, "Alternative Row-Based Reading and Writing for Non-Volatile Memory," Jun. 13, 2007.

International Preliminary Report on Patentability & The Written Opinion of the International Searching Authority, Patent Cooperation Treaty, Application No PCT/US2006/049381 filed on Dec. 27, 2006, Jul. 10, 2008.

* cited by examiner after programming first word line (WLn),
sequence = {WL(n+2), WL(n+1), WL(n+4), WL(n+3), ...},
until all but last word line has been programmed,
then last word line (WL(n+15)) is programmed

| Word Line | All Bit Lines |
|---|---|
| WL7 | page 7 |
| WL6 | page 5 |
| WL5 | page 6 |
| WL4 | page 3 |
| WL3 | page 4 |
| WL2 | page 1 |
| WL1 | page 2 |
| WL0 | page 0 |

Fig. 13A

| Word Line | Even Bit Lines | Odd Bit Lines |
|---|---|---|
| WL7 | page 14 | page 15 |
| WL6 | page 10 | page 11 |
| WL5 | page 12 | page 13 |
| WL4 | page 6 | page 7 |
| WL3 | page 8 | page 9 |
| WL2 | page 2 | page 3 |
| WL1 | page 4 | page 5 |
| WL0 | page 0 | page 1 |

Fig. 13B

| Word Line | Upper/Lower Page | All Bit Lines |
|---|---|---|
| WL7 | upper | page 15 |
| WL7 | lower | page 14 |
| WL6 | upper | page 11 |
| WL6 | lower | page 10 |
| WL5 | upper | page 13 |
| WL5 | lower | page 12 |
| WL4 | upper | page 7 |
| WL4 | lower | page 6 |
| WL3 | upper | page 9 |
| WL3 | lower | page 8 |
| WL2 | upper | page 3 |
| WL2 | lower | page 2 |
| WL1 | upper | page 5 |
| WL1 | lower | page 4 |
| WL0 | upper | page 1 |
| WL0 | lower | page 0 |

Fig. 13C

| Word Line | Upper/ Lower Page | Even Bit Lines | Odd Bit Lines |
|---|---|---|---|
| WL7 | upper | page 30 | page 31 |
|  | lower | page 28 | page 29 |
| WL6 | upper | page 22 | page 23 |
|  | lower | page 20 | page 21 |
| WL5 | upper | page 26 | page 27 |
|  | lower | page 24 | page 25 |
| WL4 | upper | page 14 | page 15 |
|  | lower | page 12 | page 13 |
| WL3 | upper | page 18 | page 19 |
|  | lower | page 16 | page 17 |
| WL2 | upper | page 6 | page 7 |
|  | lower | page 4 | page 5 |
| WL1 | upper | page 10 | page 11 |
|  | lower | page 8 | page 9 |
| WL0 | upper | page 2 | page 3 |
|  | lower | page 0 | page 1 |

Fig. 13D

| Word Line | Upper/Lower Page | Even Bit Lines | Odd Bit Lines |
|---|---|---|---|
| WL7 | upper | page 29 | page 31 |
| | lower | page 28 | page 30 |
| WL6 | upper | page 21 | page 23 |
| | lower | page 20 | page 22 |
| WL5 | upper | page 25 | page 27 |
| | lower | page 24 | page 26 |
| WL4 | upper | page 13 | page 15 |
| | lower | page 12 | page 14 |
| WL3 | upper | page 17 | page 19 |
| | lower | page 16 | page 18 |
| WL2 | upper | page 5 | page 7 |
| | lower | page 4 | page 6 |
| WL1 | upper | page 9 | page 11 |
| | lower | page 8 | page 10 |
| WL0 | upper | page 1 | page 3 |
| | lower | page 0 | page 2 |

|   | E | A | B | C |
|---|---|---|---|---|
|   | 0 | 50 | 75 | 100 |

WL(n-1)

|   |   | E | A | B | C |
|---|---|---|---|---|---|
| E | 0 | 0 | 50 | 75 | 100 |
| A | 50 | 50 | 100 | 125 | 150 |
| B | 75 | 75 | 125 | 150 | 175 |
| C | 100 | 100 | 150 | 175 | 200 |

Fig. 18A

| combined coupling (mV) | offset (mV) |
|---|---|
| 0 | 0 |
| 50, 75, 100 | 75 |
| 125, 150 | 138 |
| 175, 200 | 188 |

Fig. 18B

SYSTEMS FOR ALTERNATE ROW-BASED READING AND WRITING FOR NON-VOLATILE MEMORY

CROSS-REFERENCE TO RELATED APPLICATIONS

The following applications are cross-referenced and incorporated by reference herein in their entirety:

U.S. patent application Ser. No. 11/321,259, entitled, "ALTERNATE ROW-BASED READING AND WRITING FOR NON-VOLATILE MEMORY," by Daniel C. Guterman, filed concurrently.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. patent application Ser. No. 10/379,608, titled "Self-Boosting Technique," filed on Mar. 5, 2003; and in U.S. patent application Ser. No. 10/629,068, titled "Detecting Over Programmed Memory," filed on Jul. 29, 2003; both applications are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are across from the target floating gate because they are on both a neighboring bit line and neighboring word line.

The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than that originally programmed, because of the effect of the programmed charge on the adjacent memory cells being coupled to the first memory cell. The coupling from adjacent memory cells can shift the apparent charge level being read from a target cell by a sufficient amount to lead to an erroneous reading of the data stored therein.

The impact of the floating gate to floating gate coupling is of greater concern for multi-state devices because in multi-state devices, the allowed threshold voltage ranges and the forbidden ranges are narrower than in binary devices. Therefore, the floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than memories using only two states (binary memories). Furthermore, the reduction of the space between word lines and of the space between bit lines will also increase the coupling between adjacent floating gates.

Thus, there is a need to reduce the effect of coupling between floating gates.

SUMMARY OF THE INVENTION

A set of storage elements is programmed beginning with a word line WLn adjacent a select gate line for the set. After programming the first word line, the next word line WLn+1 adjacent to the first word line is skipped and the next word line WLn+2 adjacent to WLn+1 is programmed. WLn+1 is then programmed. Programming continues according to the sequence {WLn+4, WLn+3, WLn+6, WLn+5, . . . } until all but the last word line for the set have been programmed. The last word line is then programmed. By programming in this manner, some word lines of the set (WLn+1, WLn+3, etc.) have no subsequently programmed neighboring word lines. The memory cells of these word lines will not experience floating gate to floating gate coupling related margin shift from subsequently programmed neighboring memory cells. The word lines having no subsequently programmed neighbors are read without using offsets or compensations based on neighboring memory cells. The other word lines are read using compensations based on both subsequently programmed neighboring word lines.

In one embodiment, a method of programming a set of non-volatile storage elements is provided that includes programming non-volatile storage elements coupled (i.e., electrically connected) to a first word line adjacent a select gate line for the set of non-volatile storage elements, programming non-volatile storage elements coupled to a third word line subsequent to programming non-volatile storage elements coupled to the first word line. The third word line is adjacent to a second word line and the second word line is adjacent to the first word line. The method programs non-volatile storage elements coupled to the second word line subsequent to programming non-volatile storage elements coupled to the third word line. Programming non-volatile storage elements coupled to the second word line begins after programming non-volatile storage elements coupled to the third word line begins.

In one embodiment, a non-volatile memory system is provided that includes a first set of non-volatile storage elements coupled to a first word line adjacent to a select gate line, a second set of non-volatile storage elements coupled to a second word line adjacent to said first word line, and a third set of non-volatile storage elements coupled to a third word line adjacent to said second word line. The third set of non-volatile storage elements is programmed subsequent to the first set of non-volatile storage elements and prior to the second subset of non-volatile storage elements. Programming of non-volatile storage elements coupled to the second word line begins after programming non-volatile storage elements coupled to the third word line begins.

In one embodiment, a method of reading non-volatile storage is provided that includes reading a second set of non-volatile storage elements and a third set of non-volatile storage elements in response to a request for data from a first set of non-volatile storage elements. The second set is programmed subsequent to the first set and is adjacent to the first set. The third set is programmed subsequent to the first set and is adjacent to the first set. After reading the second and third sets, the first set of non-volatile storage elements is read using a set of read processes including a first read process that uses one or more read compare points and at least a second read process that uses one or more adjusted read compare points. Final data is provided for each non-volatile storage element of the first set from an appropriate one of the read processes based on the reading of an adjacent non-volatile storage element from the second set and the reading of an adjacent non-volatile storage element from the third set.

In one embodiment, a non-volatile memory system is provided that includes a set of non-volatile storage elements and managing circuitry in communication with the set of non-volatile storage elements. The managing circuitry reads the set of non-volatile storage elements by, for each non-volatile storage element of at least a subset of the set of non-volatile storage elements, determining an offset from a predetermined set of offsets based on a charge level stored in a first adjacent non-volatile storage element and a charge level stored in a second adjacent non-volatile storage element. The first and second adjacent non-volatile storage elements are programmed subsequent to each non-volatile storage element of the subset. The managing circuitry performs a set of read processes for the set of non-volatile storage elements where each read process uses a different one of the offsets from the predetermined set of offsets and is performed on all of the set of non-volatile storage elements. Each non-volatile storage element of the subset provides final data from an appropriate one of the read processes associated with the offset determined for each non-volatile storage element of the subset.

BRIEF DESCRIPTION OF THE DRAWINGS

FIGS. 13A-13E are tables depicting the order of programming non-volatile memory in accordance with various embodiments.
FIG. 18A is a table depicting the combined coupling values of two adjacent word lines programmed subsequent to a word line of interest.
FIG. 18B is a table depicting read offset values to be used to compensate for various combined coupling values of two word lines.

DETAILED DESCRIPTION

Figure 1:
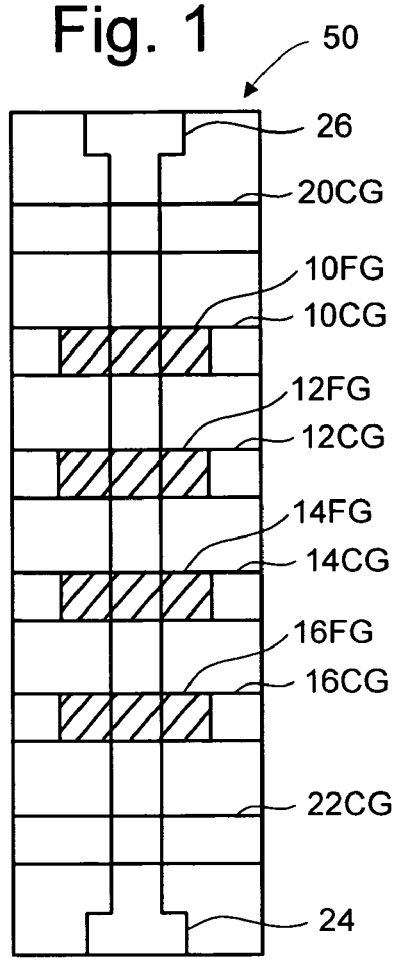
FIG. 1 is a top view of a NAND string.
Figure 2:
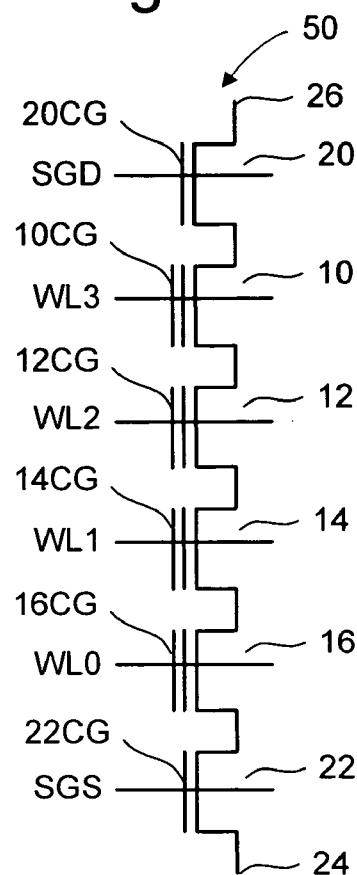
FIG. 2 is an equivalent circuit diagram of the NAND string.

One example of a memory system suitable for implementing embodiments of the present disclosure uses the NAND flash memory structure, which includes arranging multiple transistors in series between two select gates. The transistors in series and the select gates are referred to as a NAND string. FIG. 1 is a top view showing an exemplary NAND string 50. FIG. 2 is an equivalent circuit thereof. The NAND string depicted in FIGS. 1 and 2 includes transistors, 10, 12, 14, and 16, in series and sandwiched between a first select gate 20 and a second select gate 22. In one embodiment, transistors 10, 12, 14, and 16 each form an individual memory cell of the NAND string. In other embodiments, the memory cells of a NAND string may include multiple transistors or may be different than that depicted in FIGS. 1 and 2. A NAND string can include any number of memory cells, be it less than or greater than four as depicted (e.g., 2, 8, 16, 32, etc.). The discussion herein is not limited to any particular number of memory cells in a NAND string. Select gate 20 connects the NAND string to drain terminal 26 which is in turn connected to a bit line (not shown). Select gate 22 connects the NAND string to source terminal 24 which is in turn connected to a source line (not shown). Select gate 20 is controlled by applying the appropriate voltages to control gate 20CG via drain side select gate line SGD and select gate 22 is controlled by applying the appropriate voltages to control gate 22CG via source side select gate line SGS. Each of the transistors 10, 12, 14, and 16 has a control gate and a floating gate. Transistor 10 includes control gate 10CG and floating gate 10FG. Transistor 12 includes control gate 12CG and floating gate 12FG. Transistor 14 includes control gate 14CG and floating gate 14FG. Transistor 16 includes control gate 16CG and floating gate 16FG. Control gate 10CG is connected to word line WL3, control gate 12CG is connected to word line WL2, control gate 14CG is connected to word line WL1, and control gate 16CG is connected to word line WL0.

Figure 3:
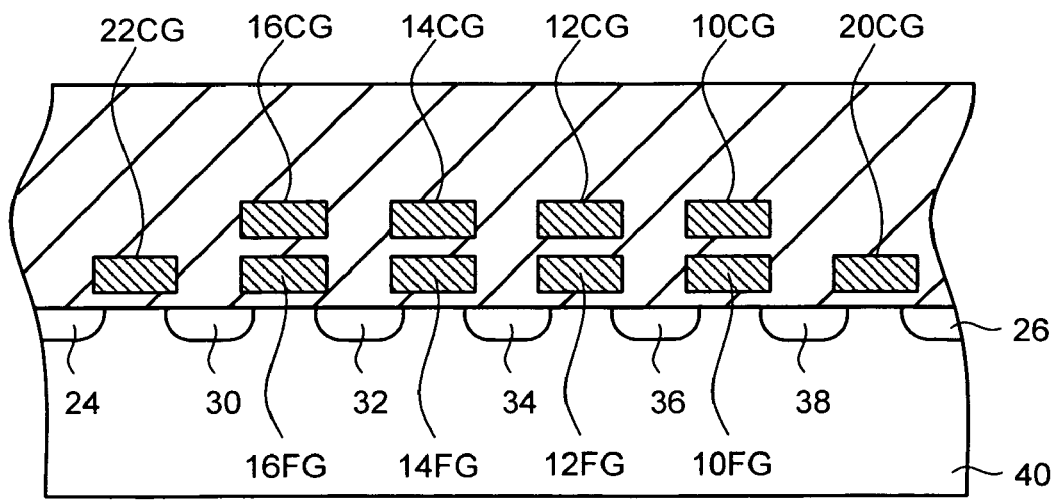
FIG. 3 is a cross-sectional view of the NAND string.

FIG. 3 provides a cross-sectional view of the NAND string described above, wherein it is assumed that there are four memory cells in the NAND string. Again, the discussion herein is not limited to any particular number of memory cells in a NAND string. As depicted in FIG. 3, the transistors of the NAND string are formed in p-well region 40. Each transistor includes a stacked gate structure that consists of a control gate (10CG, 12CG, 14CG and 16CG) and a floating gate (10FG, 12FG, 14FG and 16FG). The floating gates are formed on the surface of the p-well on top of an oxide or other dielectric film. The control gate is above the floating gate, with an inter-polysilicon dielectric layer separating the control gate and floating gate. The control gates of the memory cells (10, 12, 14 and 16) form the word lines. N+ doped layers 30, 32, 34, 36 and 38 are shared between neighboring cells, whereby the cells are connected to one another in series to form a NAND string. These N+ doped layers form the source and drain of each of the elements of the string. For example, N+ doped layer 30 serves as the drain of transistor 22 and the source for transistor 16, N+ doped layer 32 serves as the drain for transistor 16 and the source for transistor 14, N+ doped layer 34 serves as the drain for transistor 14 and the source for transistor 12, N+ doped layer 36 serves as the drain for transistor 12 and the source for transistor 10, and N+ doped layer 38 serves as the drain for transistor 10 and the source for transistor 20. N+ doped layer 26 forms the drain terminal and connects to a common bit line for multiple NAND strings, while N+ doped layer 24 forms the source terminal and connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which represent distinct memory states. The memory states are assigned logical data "1" and "0." At least one threshold voltage (Vt) breakpoint level is generally established so as to partition the threshold voltage memory window of the memory cell into the two ranges. When the cell is read by applying predetermined, fixed voltages, its source/drain conduction state is established by comparing it with the breakpoint level (or reference current). If the current read is higher than that of the breakpoint level, the cell is determined to be "on" and in one logical state. If the current is less than the breakpoint level, the cell is determined to be "off" and in the other logical state. In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on to indicate that logic zero is being stored.

A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which are assigned the data values "11," "10," "01," and "00." In one example of a NAND-type memory, the threshold voltage after an erase operation is negative and defined as "11." Positive threshold voltages are used for the progressively increasing threshold voltage states of "10," "01," and "00," respectively. In some implementations, the data values (e.g., logical states) are assigned to the progressively increasing threshold voltage ranges using a Gray code assignment (e.g., "11," "10," "00," "01") so that if the threshold voltage of a floating gate erroneously shifts to its neighboring threshold voltage or physical state, only one logical bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
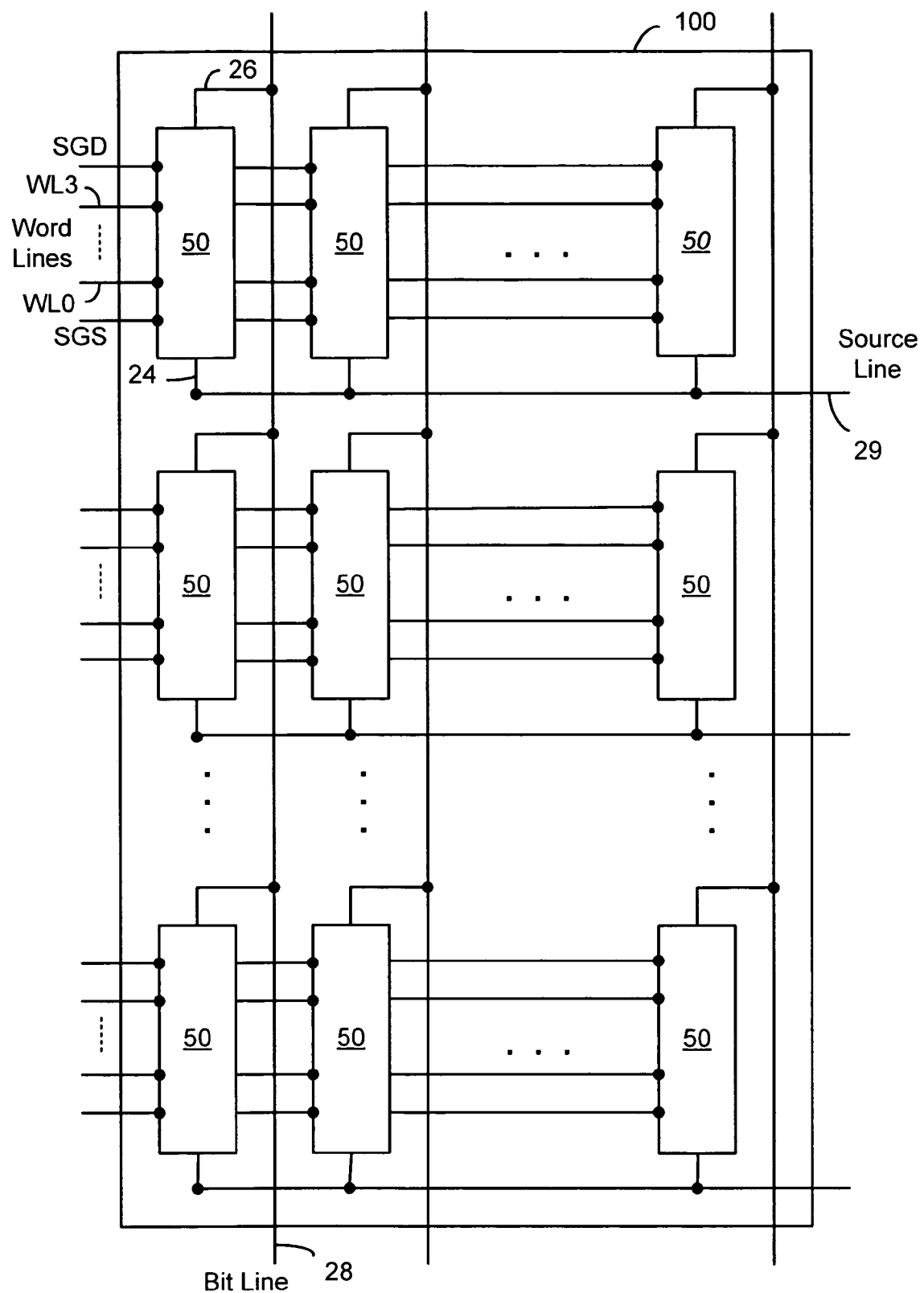
FIG. 4 is a block diagram of an array of NAND flash memory cells.

FIG. 4 illustrates an example of an array 100 of NAND strings 50, such as those shown in FIGS. 1-3. Along each column, a bit line 28 is coupled to the drain terminal, e.g. the drain 26 of the bit line select gate for the NAND string 50. Along each row of NAND strings, a source line 29 may connect all the source terminals (e.g., 24) of the source line select gates of the NAND strings. An example of a NAND architecture array and its operation as part of a memory system is found in U.S. Pat. Nos. 5,570,315; 5,774,397; and 6,046,935, all of which are incorporated herein by reference in their entirety.

The array 100 of memory cells is divided into a large number of blocks of memory cells. As is common for flash EEPROM systems, the block is the unit of erase. That is, each block contains the minimum number of memory cells that are erased together. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain.

A sector of user data is typically 512 bytes, corresponding to the size of a sector commonly used in magnetic disk drives. Overhead data is typically an additional 1620 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Those cells whose erase is to be inhibited have their word lines set to a floating condition. Due to capacitive coupling, the unselected word lines, bit lines, select lines, and common source lines are also raised to a significant fraction of the erase voltage, thus inhibiting erasing of the unselected cells. Erasing can be performed on the entire memory array, separate blocks, or another unit of cells.

Figure 5:
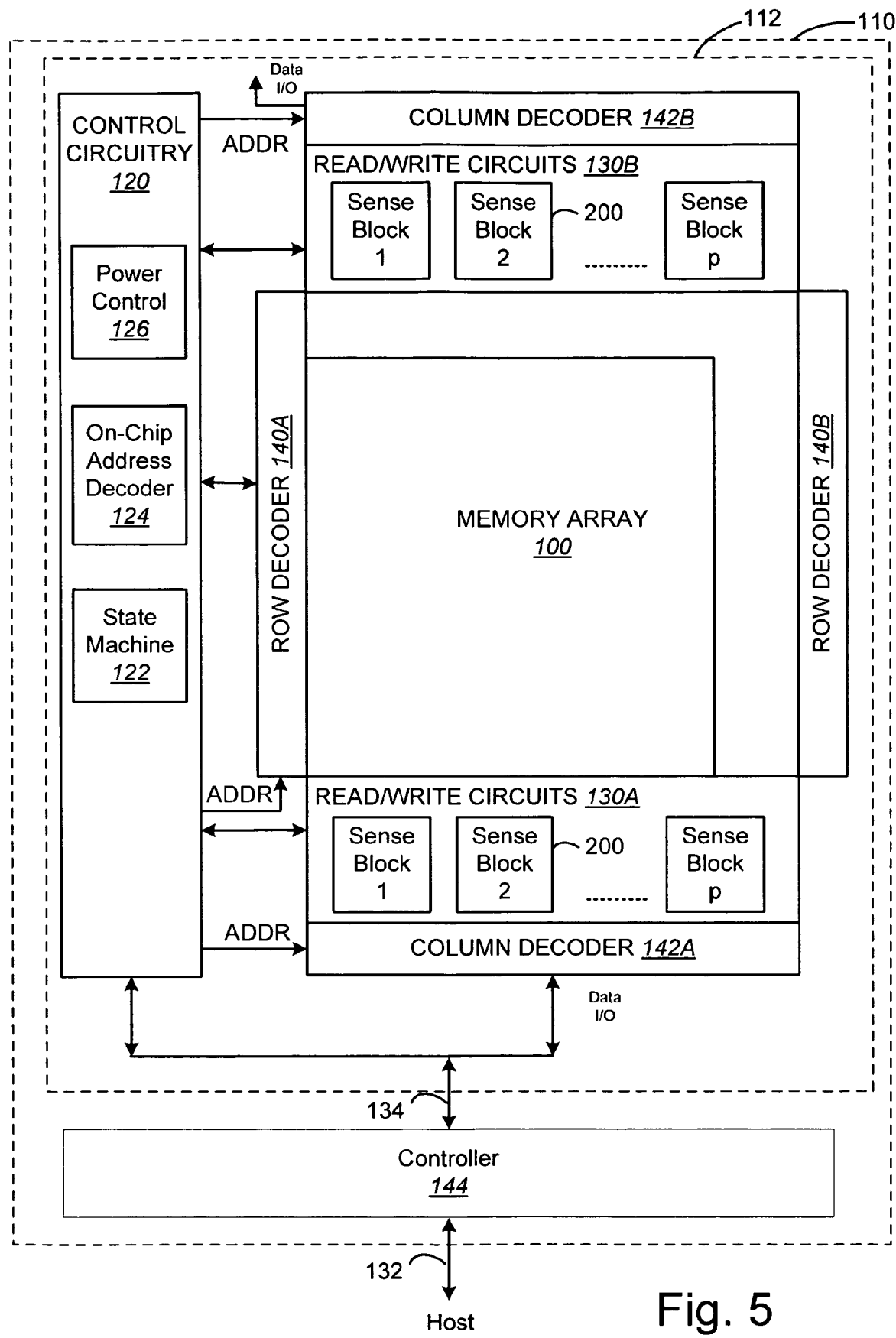
FIG. 5 is a block diagram of a non-volatile memory system.

FIG. 5 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In one embodiment, access to the memory array 100 by the various peripheral circuits is implemented in a symmetric fashion, on opposite sides of the array, so that the densities of access lines and circuitry on each side are reduced by half. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card) as the one or more memory die 112. Commands and Data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 6:
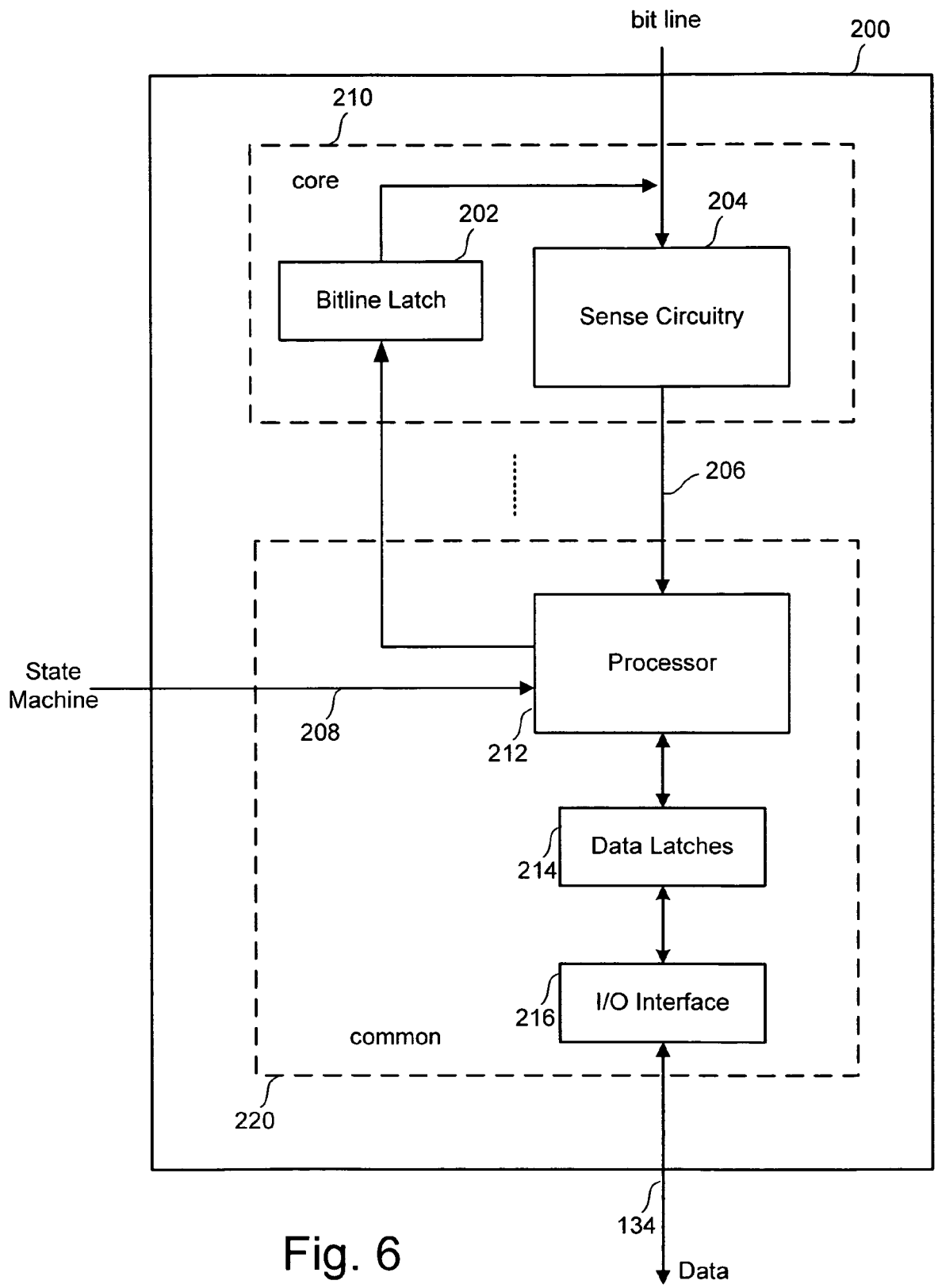
FIG. 6 is a block diagram depicting one embodiment of a sense block.

FIG. 6 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 206. For further details refer to U.S. patent application Ser. No. 11/026,536 "Non-Volatile Memory & Method with Shared Processing for an Aggregate of Sense Amplifiers" filed on Dec. 29, 2004 which is incorporated herein by reference in its entirety.

Sense module 210 comprises sense circuitry 204 that determines whether a conduction current in a connected bit line is above or below a predetermined threshold level. Sense module 210 also includes a bit line latch 202 that is used to set a voltage condition on the connected bit line. For example, a predetermined state latched in bit line latch 202 will result in the connected bit line being pulled to a state designating program inhibit (e.g., Vdd).

Common portion 220 comprises a processor 212, a set of data latches 214 and an I/O Interface 216 coupled between the set of data latches 214 and data bus 134. Processor 212 performs computations. For example, one of its functions is to determine the data stored in the sensed memory cell and store the determined data in the set of data latches. The set of data latches 214 is used to store data bits determined by processor 212 during a read operation. It is also used to store data bits imported from the data bus 134 during a program operation. The imported data bits represent write data meant to be programmed into the memory. I/O interface 216 provides an interface between data latches 214 and the data bus 134.

During read or sensing, the operation of the system is under the control of state machine 122 of FIG. 5 that controls the supply of different control gate voltages to the addressed cell. As it steps through the various predefined control gate voltages corresponding to the various memory states supported by the memory, the sense module 210 will trip at one of these voltages and an output will be provided from sense module 210 to processor 212 via bus 206. At that point, processor 212 determines the resultant memory state by consideration of the tripping event(s) of the sense module and the information about the applied control gate voltage from the state machine via input lines 208. It then computes a binary encoding for the memory state and stores the resultant data bits into data latches 214. In another embodiment of the core portion, bit line latch 202 serves double duty, both as a latch for latching the output of the sense module 210 and also as a bit line latch as described above.

During program or verify, the data to be programmed is stored in the set of data latches 214 from the data bus 134. The program operation, under the control of the state machine, comprises a series of programming voltage pulses applied to the control gates of the addressed memory cells. Each programming pulse is followed by a read back (verify) to determine if the cell has been programmed to the desired memory state threshold voltage target. Processor 212 monitors the read back memory state relative to the desired memory state. When the two are in agreement, the processor 212 sets the bit line latch 202 so as to cause the bit line to be pulled to a condition designating program inhibit (e.g., Vdd). This inhibits the cell coupled to the bit line from further programming even if programming pulses appear on its control gate. In other embodiments the processor initially loads the bit line latch 202 and the sense circuitry sets it to an inhibit value during the verify process.

Data latch stack 214 contains a stack of data latches corresponding to the sense module. In one embodiment, there are three data latches per sense module 210. In some implementations (but not required), the data latches are implemented as a shift register so that the parallel data stored therein is converted to serial data for data bus 134, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

In general, a page of memory cells is operated on in parallel. Therefore a corresponding number of sense modules 210 are in operation in parallel. In one embodiment, a page controller (not shown) expediently provides control and timing signals to the sense modules operated in parallel. For more details regarding sense modules 210 and their operation, see U.S. patent application Ser. No. 11/099,133, entitled "COMPENSATING FOR COUPLING DURING READ OPERATIONS OF NON-VOLATILE MEMORY," filed Apr. 5, 2005, incorporated by reference in its entirety.

Figure 7:
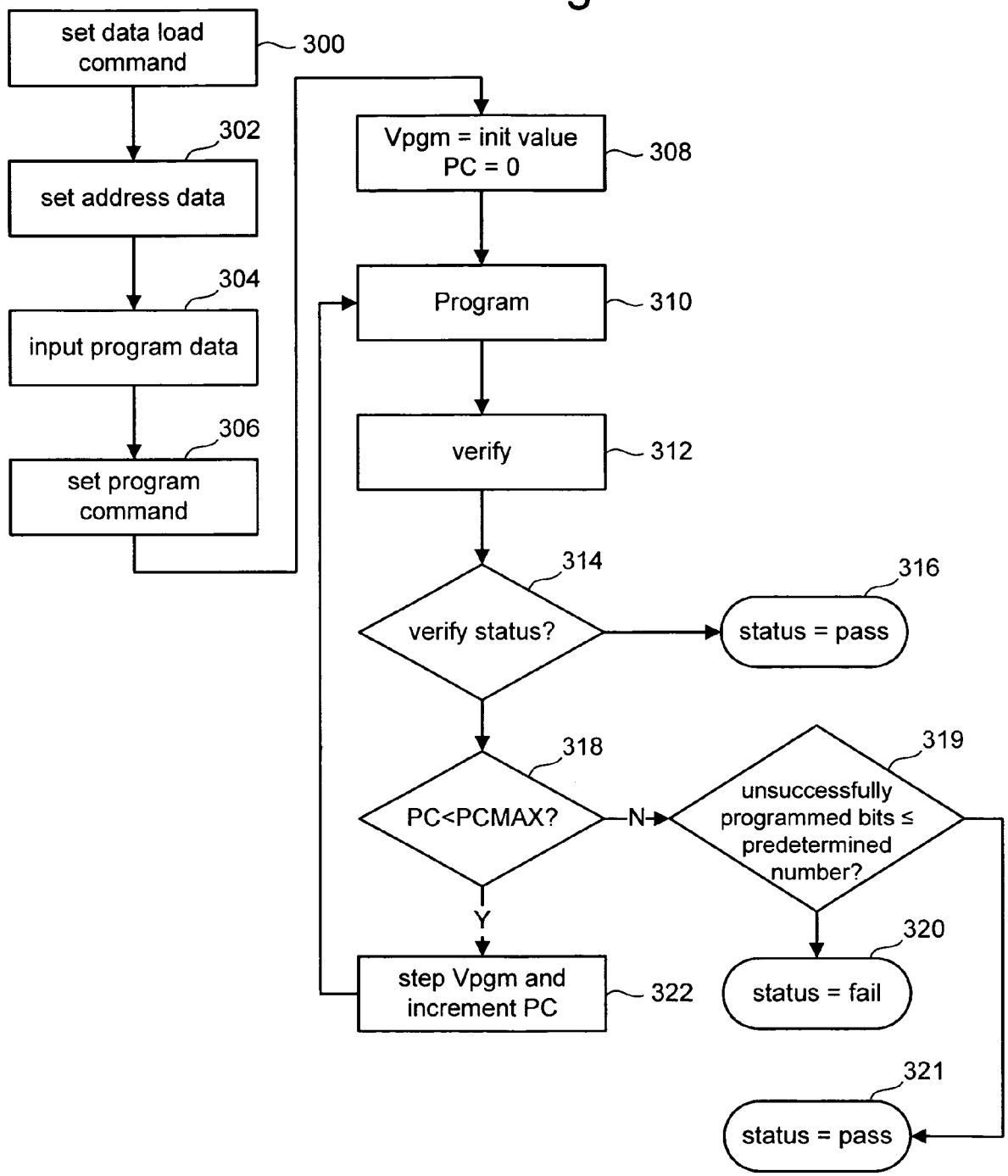
FIG. 7 is a flow chart describing one embodiment of a process for programming non-volatile memory.

FIG. 7 is a flow chart describing one embodiment of a method for programming non-volatile memory. In one implementation, memory cells are erased (in blocks or other units) prior to programming. In step 300 of FIG. 7, a "data load" command is issued by the controller and input received by control circuitry 120 of FIG. 5. In step 302, address data designating the page address is input to decoder 124 from the controller or host. In step 304, a page of program data for the addressed page is input to a data buffer for programming. That data is latched in the appropriate set of latches. In step 306, a "program" command is issued by the controller to state machine 122.

Figure 8:
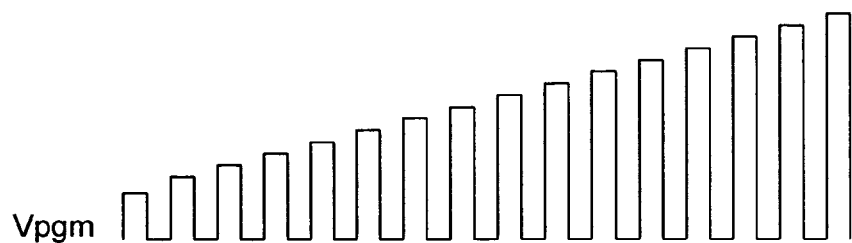
FIG. 8 is an exemplary wave form applied to the control gates of non-volatile memory cells.

Triggered by the "program" command, the data latched in step 304 will be programmed into the selected memory cells controlled by state machine 122 using the stepped pulses of FIG. 8 applied to the appropriate word line. In step 308, the program voltage Vpgm is initialized to the starting pulse (e.g., 12V) and a program counter PC maintained by state machine 122 is initialized at 0. In step 310, the first Vpgm pulse is applied to the selected word line. In one embodiment, if logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 312, the states of the selected memory cells are verified. If it is detected that the target threshold voltage of a selected cell has reached the appropriate level, then in one embodiment the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 314, it is checked whether all of the data latches are storing logic "1." If so, the programming process is complete and successful because all selected memory cells were programmed and verified. A status of "PASS" is reported in step 316.

If, in step 314, it is determined that not all of the data latches are storing logic "1," then the programming process continues. In step 318, the program counter PC is checked against a program limit value PCMAX. One example of a program limit value is 20; however, other numbers can also be used. If the program counter PC is not less than PCMAX, then it is determined at step 319 whether the number of bits that have not been successfully programmed is equal to or less than a predetermined number. If the number of unsuccessfully programmed bits is equal to or less than the predetermined number, then the programming process is flagged as passed and a status of pass is reported at step 321. The bits that are not successfully programmed can be corrected using error correction during the read process. If however, the number of unsuccessfully programmed bits is greater than the predetermined number, the program process is flagged as failed and a status of fail is reported at step 320. If the program counter PC is less than PCMAX, then the Vpgm level is increased by the step size and the program counter PC is incremented at step 322. After step 322, the process loops back to step 310 to apply the next Vpgm pulse.

Figure 9:
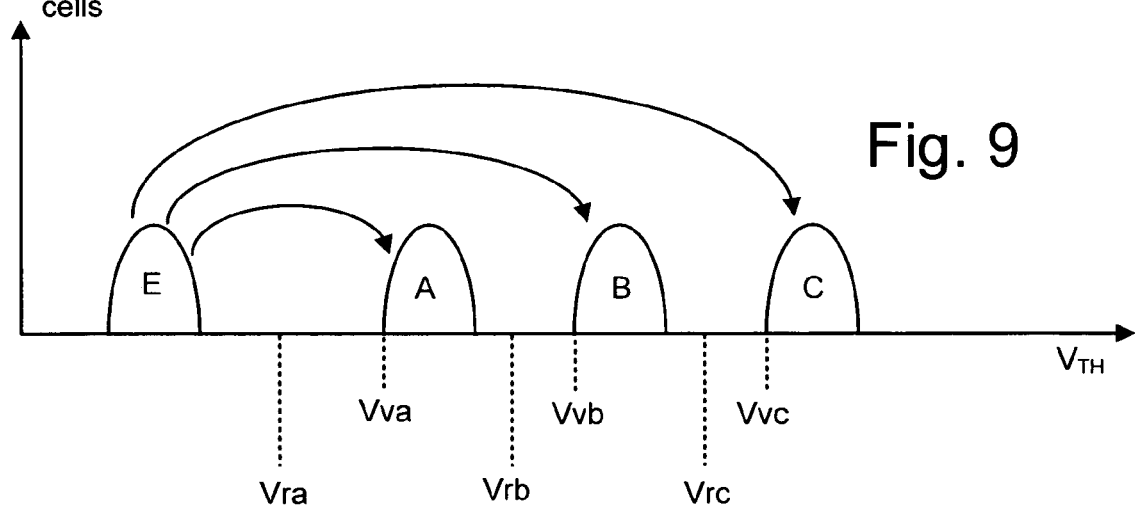
FIG. 9 depicts an exemplary set of threshold voltage distributions.

At the end of a successful program process, the threshold voltages of the memory cells should be within one or more distributions of threshold voltages for programmed memory cells or within a distribution of threshold voltages for erased memory cells, as appropriate. FIG. 9 illustrates threshold voltage distributions for the memory cell array when each memory cell stores two bits of data. FIG. 9 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 9 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 9 shows four states, the present invention can also be used with other multi-state structures including those that include more or less than four states.

FIG. 9 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 9 also shows three verify reference voltages, Vva, Vvb and Vvc. When programming memory cells to state A, the system will test whether those memory cells have reached a threshold voltage greater than or equal to Vva. When programming memory cells to state B, the system will test whether the memory cells have reached a threshold voltage greater than or equal to Vvb. When programming memory cells to state C, the system will determine whether memory cells have reached a threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. The process depicted in FIG. 7, using the control gate voltage sequence depicted in FIG. 8, will then be used to program memory cells directly into states A, B or C. While some memory cells are being programmed from state E to state A, other memory cells are being programmed from state E to state B and/or from state E to state C. When programming from state E to state C on WLn, the amount of coupling to the adjacent floating gate under WLn−1 (and/or WLn+1 as hereinafter described) is a maximum since the change of voltage on the floating gate(s) under WLn is maximum. When programming from state E to state B the amount of coupling to the adjacent floating gate is reduced but still significant. When programming from state E to state A the amount of coupling is reduced even further. Consequently the amount of correction required to subsequently read each state of subsequently programmed row(s) WLn−1 and/or WLn+1 will vary depending on the state of the adjacent cell on previously programmed row WLn.

Figure 10:
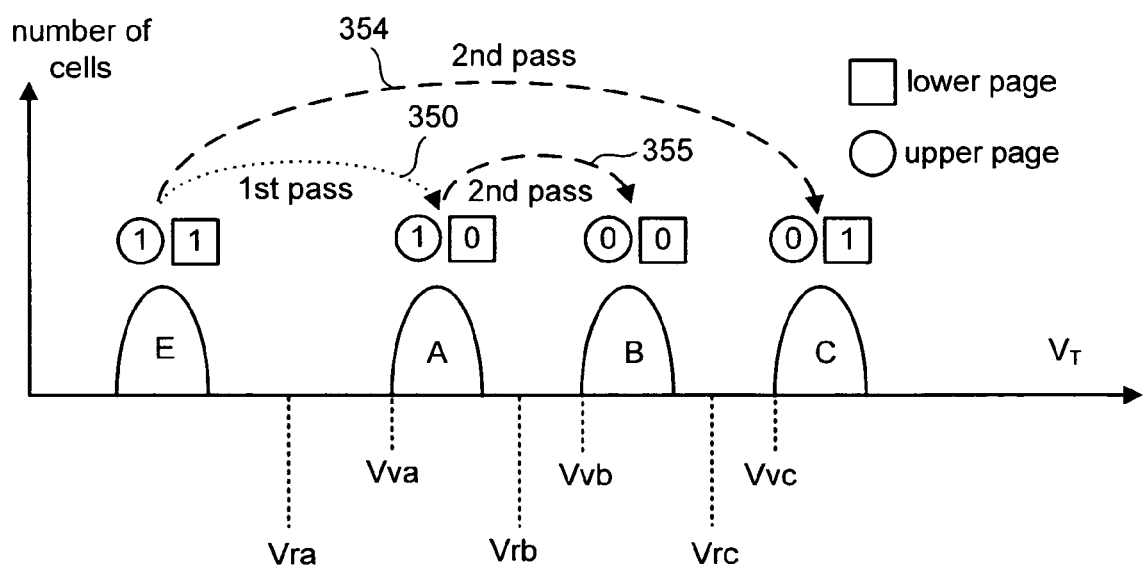
FIG. 10 depicts an exemplary set of threshold voltage distributions.

FIG. 10 illustrates an example of a two-pass technique of programming a multi-state memory cell that stores data for two different pages: a lower page and an upper page. Four states are depicted: state E (11), state A (10), state B (0) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 350. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 354. If the cell had been programmed into state A as a result of the first programming pass, then the memory cell is further programmed in the second pass so that the threshold voltage is increased to be within state B, as depicted by arrow 355. The result of the second pass is to program the cell into the state designated to store a logic "0" for the upper page without changing the data for the lower page. In both FIG. 9 and FIG. 10 the amount of coupling to the floating gate under the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Floating gate to floating gate coupling can cause unrecoverable errors during read operations which may necessitate the performance of an error recovery step during reading. The apparent charge stored on the floating gate of a memory cell can undergo an apparent shift because of coupling from an electric field resulting from charge stored on a subsequently programmed neighboring memory cell's floating gate. This phenomenon is often referred to as floating gate to floating gate coupling or more simply, just floating gate coupling. While in theory the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, across from each other in a diagonal direction. The apparent shift in charge can result in errors when reading the programmed memory state of a memory cell.

The effects of floating gate coupling are most pronounced in situations where a memory cell adjacent a target memory cell is programmed subsequent to the target memory cell (e.g., in an odd/even bit line architecture), however its effects may be seen in other situations as well. The charge so placed on the floating gage of the adjacent memory cell, or a portion of the charge, will couple to the target memory cell resulting in an apparent shift of the threshold voltage of the target memory cell. This change in the apparent threshold voltage of the memory cell can result in a read error when subsequently reading the target memory cell. For example, a memory cell can have its apparent threshold voltage shifted to such a degree after being programmed that it will not turn on or not turn on to a sufficient degree under the applied reference read voltage for the memory state to which it was programmed.

In typical programming techniques, rows of memory cells are programmed starting with the word line (WL0) adjacent to the source side select gate line. Programming proceeds sequentially thereafter (WL1, WL2, WL3, etc.) such that at least one page of data is programmed in an adjacent word line (WLn+1) after completing programming (placing each cell of the word line into its final state) of the preceding word line (WLn). The pattern of programming results in an apparent shift of the threshold voltage of memory cells after they have been programmed due to the floating gate to floating gate coupling effect. For every word line except the last word line of a string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest.

Figure 11:
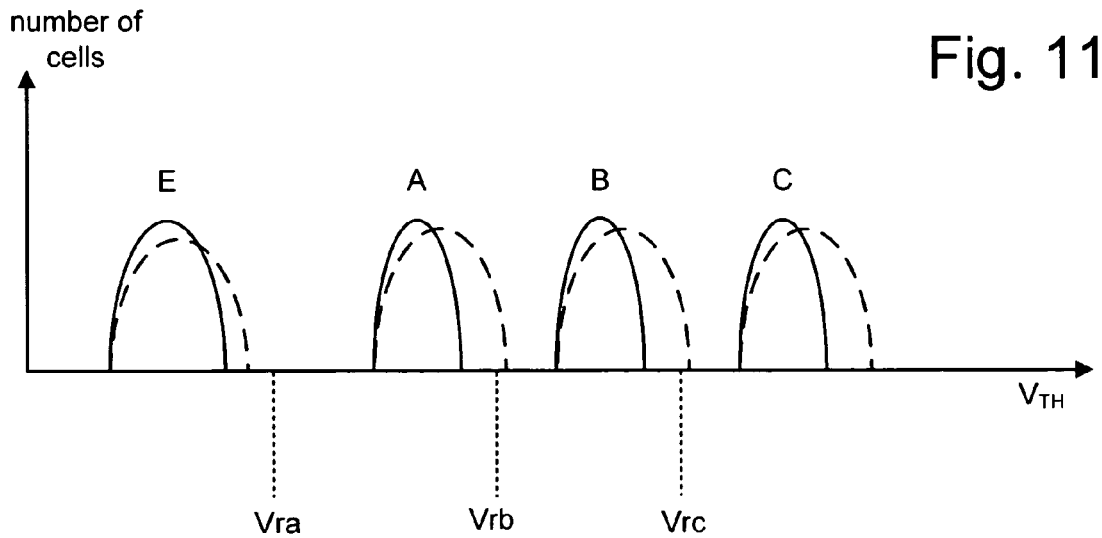
FIG. 11 depicts an exemplary set of threshold voltage distributions for a group of memory cells before and after one or more groups of adjacent memory cells are programmed.

FIG. 11 shows the apparent threshold voltage distributions for a row of memory cells (e.g., WLn) before (solid curves) and after (dotted curves) its adjacent neighboring row (WLn+1) is programmed. Each distribution is widened as a result of adding negative charge to the floating gates of the memory cells of the adjacent word line. Because of the floating gate to floating gate coupling effect, the negative charge of a later programmed memory cell on WLn+1 will raise the apparent threshold voltage of a memory cell on WLn that is connected to the same bit line. The later programmed cells can also effect the apparent threshold voltage of memory cells of WLn that are connected to different bit lines, such as those connected to adjacent bit lines. Because the distributions are widened, memory cells may be read incorrectly as in an adjacent state. Memory cells at the upper end of each distribution can have an apparent threshold voltage above a corresponding read compare point. For example, when applying reference voltage Vrb, certain memory cells programmed to state A, may not conduct sufficiently because of the shift in their apparent threshold voltage. These cells may incorrectly be read as in state B, causing read errors.

Figure 12:
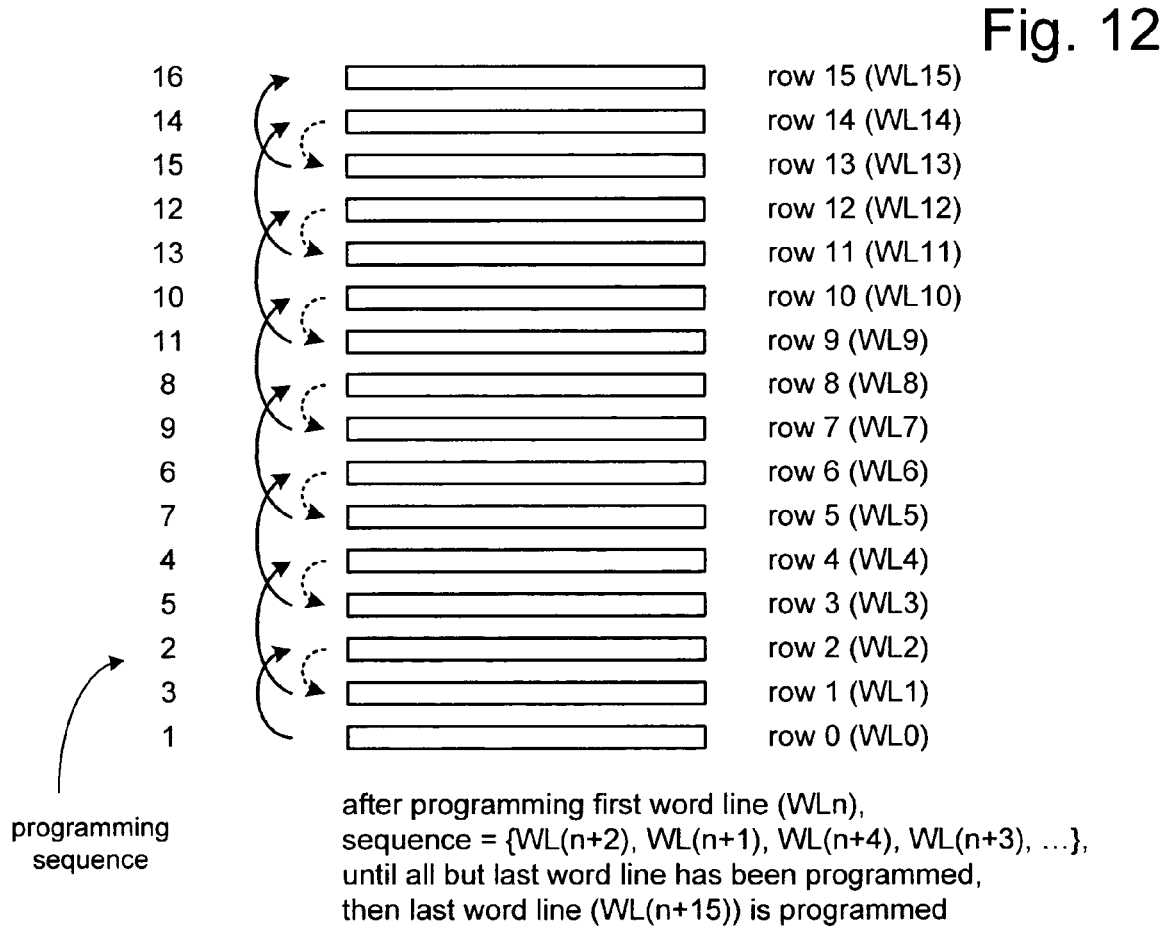
FIG. 12 is a diagram of a programming sequence in accordance with one embodiment.

In accordance with one embodiment, a novel alternate row-based programming technique is used to reduce or eliminate the apparent shift in threshold voltage for memory cells for selected rows. FIG. 12 depicts a technique in accordance with one embodiment. Rather than sequentially program rows as in prior art techniques, an alternate row method is used. Programming begins with row 0 (WL0) which is adjacent a select gate line for the set of memory cells being programmed. In this case, the set of memory cells is a block including 16 word lines and programming begins at the source side. Any size block or other unit of programming can be used in accordance with embodiments. For example, 4, 8, 32, or more word lines could be programmed using these techniques. Moreover, programming could begin at the drain side rather than the source side. The key is that programming proceeds in an alternate fashion such that a portion of the rows have no subsequently programmed adjacent rows. By programming such that no adjacent rows are programmed after completing programming for selected rows, no subsequently programmed floating gate to floating gate coupling impact will be experienced for these selected rows. While embodiments are described as addressing the impacts of floating to gate to coupling, it will be appreciated that the impacts of other phenomena such as those associated with pattern sensitivity impedance loading may potentially be addressed as well using the described techniques.

In order to accomplish this technique, two even rows are programmed, beginning with the first row to be programmed, and then the intervening odd row is programmed. After programming the intervening odd row, the next even row is programmed, and then the next intervening odd row. In this manner, each odd row will have no adjacent rows that are programmed after programming the odd row. As used herein, the term even row or word line refers to one row of a set of rows that includes the first row to be programmed for that set and then every other row of the set as one proceeds sequentially through the set. Odd row refers to one row of a set of rows that includes the row adjacent to the first row to be programmed for the set and every other row of the set as one proceeds sequentially through the set. The terms are not dependent upon the name or label given to a row but rather, its placement within the set relative to where programming begins. In FIG. 12, programming begins with row 0, so rows 0 (WL0), 2 (WL2), 4(WL4), 6(WL6), 8(WL8), 10(WL10), 12(WL12), and 14(WL14) are the even rows and rows 1(WL1), 3(WL3), 5(WL5), 7(WL7), 9(WL9), 11(WL11), 13(WL13), and 15(WL15) are the odd rows.

After programming row 0 (one or more pages), row 2 is programmed (one or more pages) followed by programming row 1 (one or more pages). While various types of programming can be used, programming the two even rows, row 0 and row 2, should be completed prior to completing programming of row 1 so that no coupling impacts or effects are present in row 1 due to subsequent programming of rows 0 and 2. In an alternative embodiment, row 2 can be programmed first, followed by programming row 0. This will still provide no coupling impacts for row 1 due to subsequent programming of rows 0 and 2 since they both are still programmed before row 1. In either scenario, subsequent programming proceeds as follows. After programming row 1, the next even row (row 4) to be programmed is programmed, followed by programming the next odd row (row 3) to be programmed. Programming row 4 could begin before completing programming of row 1, but programming row 3 should not be completed until programming of row 4 is complete to avoid subsequent programming coupling effects. This pattern continues until every row but the last row has been programmed. The second to last row to be programmed is an odd row (row 13). After programming row 13, the last row (row 15) is programmed.

The sequence of programming the set is given below the row diagram. After programming the first row (WLn) to be programmed, programming proceeds according to the word line sequence {WLn+2, WLn+1, WLn+4, WLn+3, ...} until all word lines except the last word line has been programmed. After programming all but the last word line, the last word line is programmed.

There will be three different coupling scenarios in a set of memory cells programmed according to the technique of FIG. 12. The first word line (WL0) to be programmed will experience floating gate to floating gate coupling from one subsequently programmed word line (WL1), the other even word lines will experience floating gate to floating gate coupling from two subsequently programmed word lines (WLn+1 and WLn−1), and the odd word lines will experience no floating gate to floating gate coupling from any subsequently programmed adjacent word lines. Because the odd word lines experience no floating gate to floating gate coupling from subsequently programmed adjacent word lines, they can be treated differently. For example, they can be programmed more quickly using larger program voltage step sizes as they will not experience a decrease in the margin between states from subsequently programmed cells. Thus, despite being programmed less precisely with larger program voltage steps, they can still maintain reliable read margins. In one embodiment, data may be written more densely within the odd rows.

FIGS. 13A-13E depict various tables describing the order of programming according to various embodiments for the technique of FIG. 12. As described above, each block includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.). Examples of an architecture using odd/even programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; U.S. Pat. No. 6,771,536; U.S. Pat. No. 6,781,877. Additionally, U.S. patent application Ser. No. 11/099,133, entitled "COMPENSATING FOR COUPLING DURING READ OPERATIONS OF NON-VOLATILE MEMORY," filed Apr. 5, 2005, incorporated by reference in its entirety, describes examples of full sequence and two-pass programming for both all bit line and odd/even bit line programming architectures. Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming.

FIG. 13A is a table that describes the order for programming memory cells for all bit line programming according to the technique of FIG. 12. The embodiment of FIG. 13A is for full sequence programming (e.g., FIG. 9). In this embodiment, the block being programmed includes eight word lines (WL0-WL7), each storing one page of data (pages 0-7). The pages are written in sequential order beginning with page 0. Page 0 is written first and includes the data stored by all the memory cells coupled to word line WL0. Page 1 is written second and includes the data stored by all the memory cells coupled to word line WL2. Page 2 is written third and includes the data stored by all the memory cells coupled to word line WL1. Page 3 is written fourth and includes the data stored by all the memory cells coupled to word line WL4. Page 4 is written fifth and includes the data stored by all the memory cells coupled to WL3. Page 5 is written sixth and includes the data stored by all the memory cells coupled to word line WL6. Page 6 is written seventh and includes the data stored by all the memory cells coupled to word line WL5. Page 7 is written last and includes the data stored by all the memory cells coupled to word line WL7. Since page 2 is written for word line WL1 after writing page 0 for word line WL0 and page 1 for word line WL2, the apparent threshold voltage for memory cells coupled to word line WL1 will not be affected by any subsequently written memory cells of word lines WL0 or WL2. This will be the case for each odd row (WL1, WL3, WL5, and WL7). The first even row WL0 will be affected by the subsequent programming of word line WL1 and each other even row (WL2, WL4, and WL6) will be affected by the subsequent programming of two adjacent rows (e.g., row WL3 and WL5 for row WL4).

In another embodiment of full sequence programming, the data can be written first to even bit lines and then to odd bit lines. FIG. 13B depicts the order of programming even and odd bit lines when using full sequence programming (FIG. 9) according to the technique of FIG. 12. In this embodiment, a block with eight word lines includes sixteen pages of data. Each word line stores two pages of data with the even bit lines for each word line storing one page and the odd bit lines another. Again, the pages are written in sequential order beginning with page 0.

Page 0 is written first and includes the data stored by the memory cells of word line WL0 that are coupled to even bit lines. Page 1 is written second and includes the data stored by the memory cells of word line WL0 that are coupled to odd bit lines. Page 2 is written third and includes the data stored by the memory cells of word line WL2 that are coupled to even bit lines. Page 3 is written fourth and includes the data stored by the memory cells of word line WL2 that are coupled to odd bit lines. Page 4 is written fifth and includes the data stored by the memory cells of word line WL1 that are coupled to even bit lines. Page 5 is written sixth and includes the data stored by the memory cells of word line WL1 that are coupled to odd bit lines. Page 6 is written seventh and includes the data stored by the memory cells of word line WL4 that are coupled to even bit lines. Page 7 is written eighth and includes the data stored by the memory cells of word line WL4 that are coupled to odd bit lines. Page 8 is written ninth and includes the data stored by the memory cells of word line WL3 that are coupled to even bit lines. Page 9 is written tenth and includes the data stored by the memory cells of word line WL3 that are coupled to odd bit lines. Page 10 is written eleventh and includes the data stored by the memory cells of word line WL6 that are coupled to even bit lines. Page 11 is written twelfth and includes the data stored by the memory cells of word line WL6 that are coupled to odd bit lines. Page 12 is written thirteenth and includes the data stored by the memory cells of word line WL5 that are coupled to even bit lines. Page 13 is written fourteenth and includes the data stored by the memory cells of word line WL5 that are coupled to odd bit lines. Page 14 is written fifteenth and includes the data stored by the memory cells of word line WL7 that are coupled to even bit lines. Page 15 is written sixteenth and includes the data stored by the memory cells of word line WL7 that are coupled to odd bit lines.

As with the all bit line programming approach, all necessary pages of data are written to adjacent even word lines before writing pages to an intervening odd word line. The memory cells of the odd word lines will not experience any coupling due to negative charge added to adjacent memory cells after programming the odd word lines since the even word lines are programmed first.

The table of FIG. 13C describes the order of programming for an all bit line approach when using the two-phase programming process of FIG. 10 according to the technique of FIG. 12. A block with eight word lines is depicted where each word line stores two pages of data (an upper page and a lower page). The pages are programmed in sequential numerical order with two even word lines being programmed before programming an intervening odd word line. For memory cells coupled to word line WL0, the lower page of data forms page 0 and the upper page of data forms page 1. Word line WL0 is programmed first. For the memory cells of WL2 which are programmed subsequent to the memory cells of word line WL0, the lower page of data forms page 2 and the upper page of data forms page 3. For the memory cells of WL1 which are programmed subsequent to the memory cells of word line WL2, the lower page of data forms page 4 and the upper page of data forms page 5. For the memory cells of WL4 which are programmed subsequent to the memory cells of word line WL1, the lower page of data forms page 6 and the upper page of data forms page 7. For the memory cells of WL3 which are programmed subsequent to the memory cells of word line WL4, the lower page of data forms page 8 and the upper page of data forms page 9. For the memory cells of WL6 which are programmed subsequent to the memory cells of word line WL4, the lower page of data forms page 10 and the upper page of data forms page 11. For the memory cells of WL5 which are programmed subsequent to the memory cells of word line WL6, the lower page of data forms page 12 and the upper page of data forms page 13. For the memory cells of WL7 which are programmed subsequent to the memory cells of word line WL5, the lower page of data forms page 14 and the upper page of data forms page 15.

The table of FIG. 13D describes the order of programming for an odd/even bit line approach when using the two-phase programming process of FIG. 10 according to the technique of FIG. 12. A block with eight word lines is depicted where each word line stores four pages of data (two pages each for the upper page and lower page). The pages are programmed in sequential numerical order with two even word lines being programmed before programming an intervening odd word line. For memory cells of word line WL0 (programmed first) that are on even bit lines, the lower page of data forms page 0 and the upper page of data forms page 2. For memory cells of word line WL0 that are on odd bit lines, the lower page of data forms page 1 and the upper page of data forms page 3. For memory cells of word line WL2 (programmed subsequent to word line WL0) that are on even bit lines, the lower page of data forms page 4 and the upper page of data forms page 6. For memory cells of word line WL0 that are on odd bit lines, the lower page of data forms page 5 and the upper page of data forms page 7. For memory cells of word line WL1 (programmed subsequent to word line WL2) that are on even bit lines, the lower page of data forms page 8 and the upper page of data forms page 10. For memory cells of word line WL1 that are on odd bit lines, the lower page of data forms page 9 and the upper page of data forms page 11. For memory cells of word line WL4 (programmed subsequent to word line WL1) that are on even bit lines, the lower page of data forms page 12 and the upper page of data forms page 14. For memory cells of word line WL4 that are on odd bit lines, the lower page of data forms page 13 and the upper page of data forms page 15. For memory cells of word line WL3 (programmed subsequent to word line WL4) that are on even bit lines, the lower page of data forms page 16 and the upper page of data forms page 18. For memory cells of word line WL3 that are on odd bit lines, the lower page of data forms page 17 and the upper page of data forms page 19. For memory cells of word line WL6 (programmed subsequent to word line WL3) that are on even bit lines, the lower page of data forms page 20 and the upper page of data forms page 22. For memory cells of word line WL6 that are on odd bit lines, the lower page of data forms page 21 and the upper page of data forms page 23. For memory cells of word line WL5 (programmed subsequent to word line WL6) that are on even bit lines, the lower page of data forms page 24 and the upper page of data forms page 26. For memory cells of word line WL5 that are on odd bit lines, the lower page of data forms page 25 and the upper page of data forms page 27. For memory cells of word line WL7 (programmed subsequent to word line WL5) that are on even bit lines, the lower page of data forms page 28 and the upper page of data forms page 30. For memory cells of word line WL7 that are on odd bit lines, the lower page of data forms page 29 and the upper page of data forms page 31. The table of FIG. 13E describes an alternative approach to FIG. 13D. When programming each individual word line according to the approach of FIG. 13E, both lower and upper pages are programmed for the even bit lines before programming the lower and upper pages for the odd bit lines.

Figure 14:
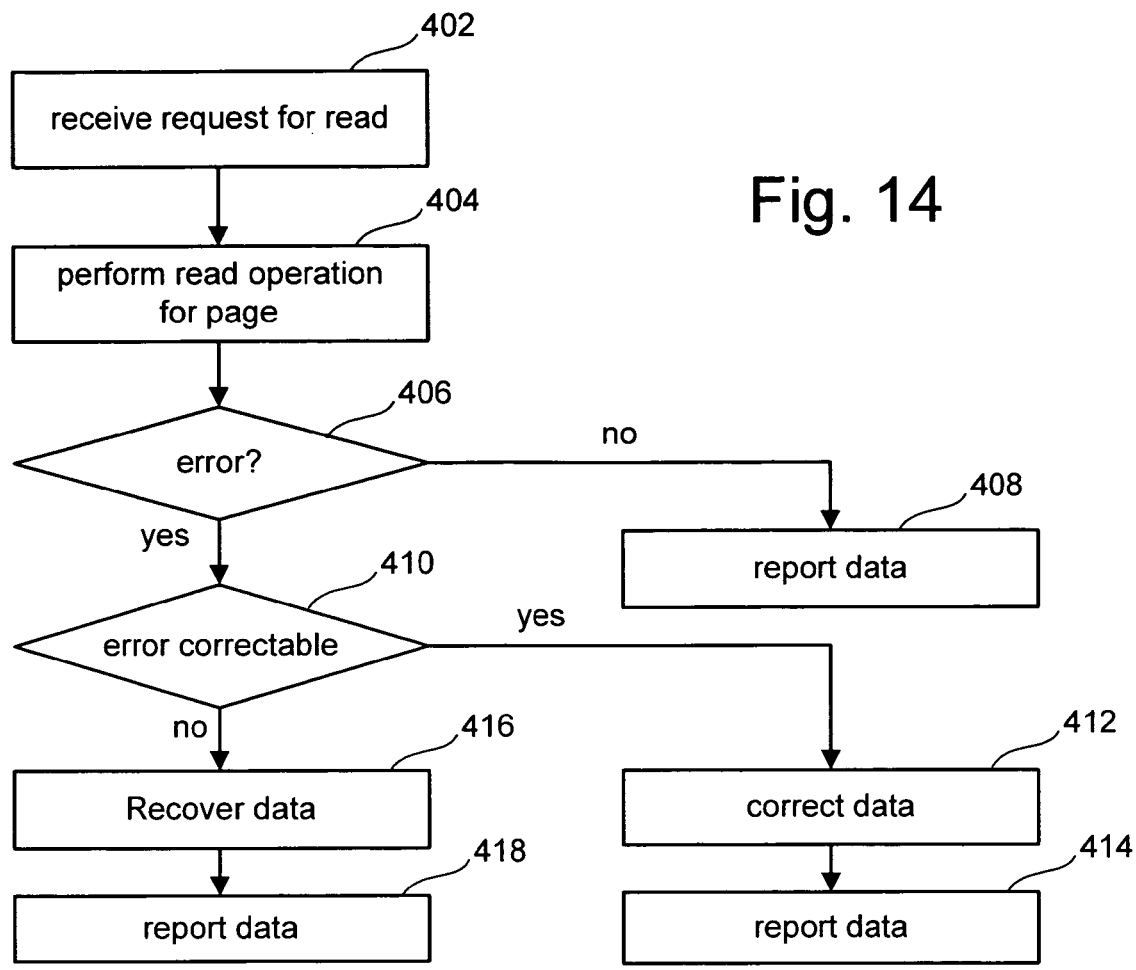
FIG. 14 is a flowchart describing one embodiment of a process for reading non-volatile memory.

FIG. 14 is a flow chart describing one embodiment for reading data from non-volatile memory cells. The discussion above with respect to the sense modules discusses how data is read from particular bit lines. FIG. 14 provides one embodiment of the read process at the system level. At step 404, a read operation is performed for a particular page in response to a request to read data received at step 402. In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page, the ECCs will be used to determine whether there are any errors in the data (step 406). The ECC process can be performed on the controller, the state machine or elsewhere in the system. If there are no errors in the data, the data is reported to the user at step 408. For example, data will be communicated to a controller or host via data I/O lines 134 shown in FIG. 6. If an error is found at step 406, it is determined whether the error is correctable at step 410. The error may be due to the floating gate to floating gate coupling effect or possibly to other physical mechanisms. Various ECC methods have the ability to correct a predetermined number of errors in a set of data. If the ECC process can correct the data, then the ECC process is used to correct that data at step 412 and the data, as corrected, is reported to the user in step 414.

If the data is not correctable by the ECC process, a data recovery process is performed in step 416. In some embodiments, an ECC process will be performed after step 416. More details about the data recovery process are described below. After the data is recovered, that data is reported at step 418. Note that the process of FIG. 14 can be used with data programmed using all bit line programming or odd/even bit line programming.

Figure 15:
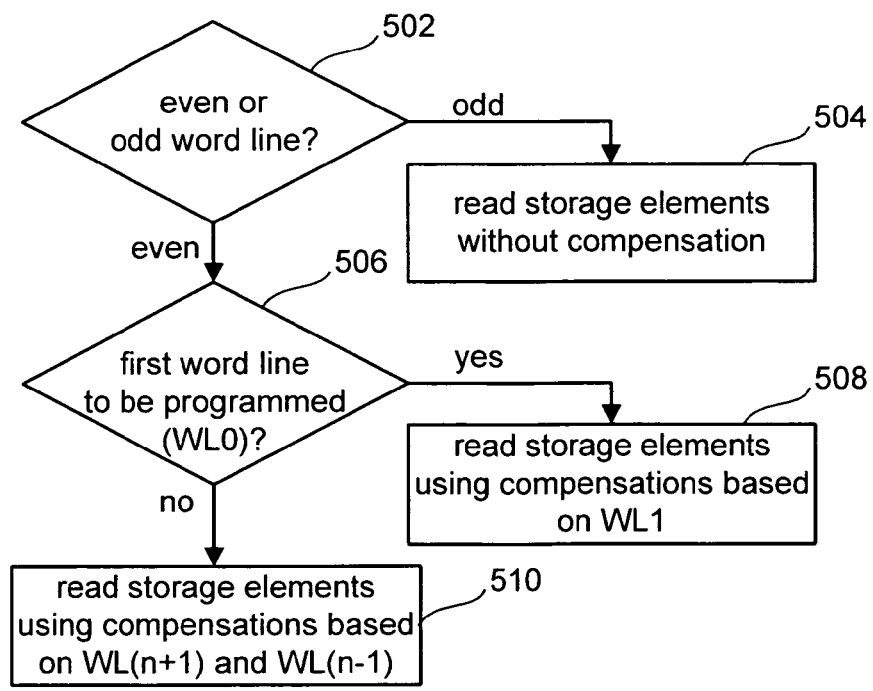
FIG. 15 is a flowchart describing one embodiment of a process for performing a read operation for non-volatile memory.

FIG. 15 is a flowchart of a novel technique for reading non-volatile storage that has been programmed according to the technique of FIG. 12. The technique of FIG. 15 can be used at step 404 of FIG. 14 for reading a page of memory cells. The process of FIG. 15 can be performed for a page that encompasses all bit lines of a block, only odd bit lines of a block, only even bit lines of a block, or other subsets of bit lines of a block. After receiving a request for reading data from the memory (data of one or more pages may be requested), reading data of a particular page begins at step 502 where it is determined whether the memory cells storing data for the requested page are coupled to an even word line or an odd word line. If data for the page is stored in an odd word line, the appropriate memory cells of the selected word line are read at step 504 using a standard read process, the two word lines adjacent to a particular odd word line having been programmed prior to programming the particular odd word line. Thus, no coupling effects from subsequently programmed adjacent memory cells are present and the memory cells can be read without compensating for such coupling and any associated shift in the apparent threshold voltage of the memory cells.

If the requested page is stored in memory cells coupled to an even word line, it is determined in step 506 if the requested even word line was the first word line (WL0) to be programmed for the block of memory cells of which the requested word line is a part. If the requested page is stored in the first word line to be programmed, then the memory cells are read at step 508 using compensations or offsets based on the programmed status of memory cells of word line WL1. Word line WL1 is programmed subsequent to word line WL0 and thus, the memory cells of the word line WL1 may cause an apparent shift in the threshold voltage of memory cells coupled to word line WL0.

Alternatively, if the requested page is not stored in memory cells of the first even word line to be programmed, the memory cells storing data for the requested page are read at step 510 using compensations based on the programmed status of each neighboring odd word line (WLn−1 and WLn+1). Each even word line except the first word line to be programmed will be adjacent to two odd word lines that are programmed subsequent to it. Thus, the negative charge stored in the floating gates of memory cells on WLn+1 and WLn−1 may cause an apparent shift in the threshold voltage of memory cells coupled to the word line of interest (WLn).

The process of FIG. 15 has been described for the performance of a read operation for a page at step 404 of FIG. 14. Alternatively, the process of FIG. 15 may also be used as part of the data recovery at step 416 after detecting errors during a read process of an even row. If performed as part of a recovery process, step 504 is optional.

Figure 16:
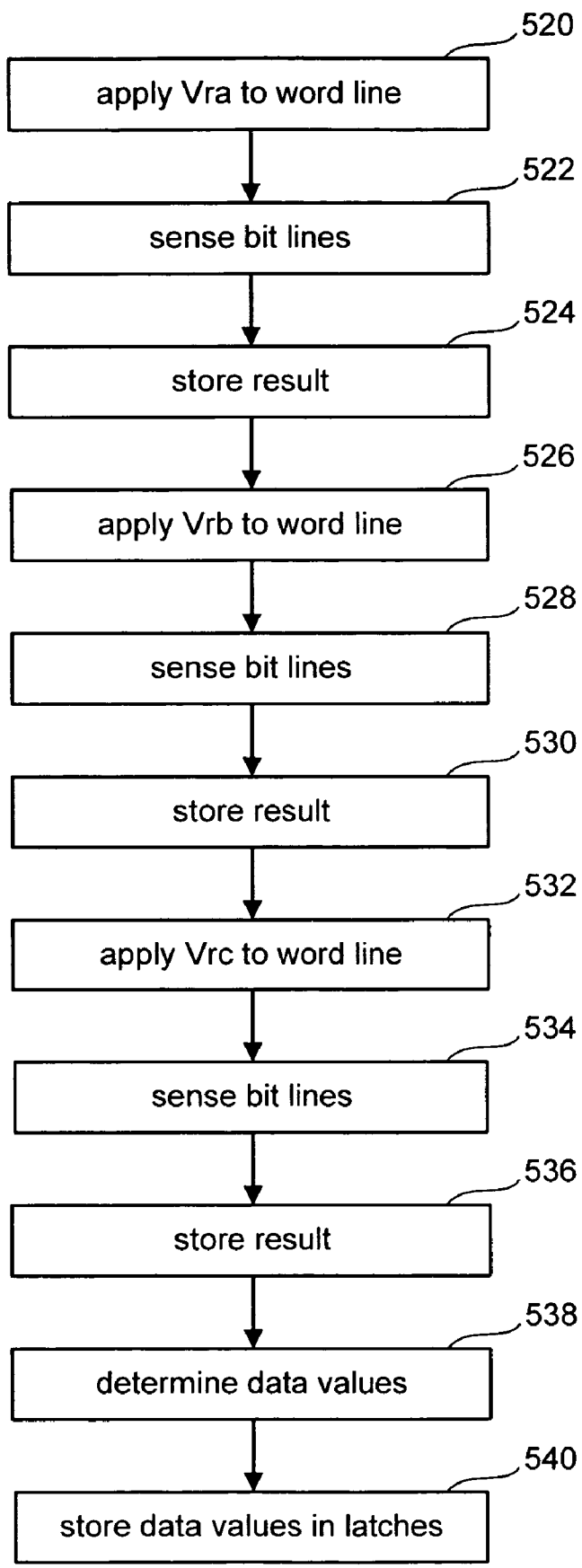
FIG. 16 is a flow chart describing one embodiment of a process for performing a read operation for non-volatile memory.

FIG. 16 is a flow chart describing one embodiment of a process for performing a standard read operation for a page (step 504 of FIG. 15). The process of FIG. 16 can be performed for a page that encompasses all bit lines of a block, only odd bit lines of a block, only even bit lines of a block, or other subsets of bit lines of a block. In step 520, read reference voltage Vra is applied to the appropriate word line associated with the page. In step 522, the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E) as shown in FIG. 9. In step 524 the result of the sensing for the bit lines is stored in the appropriate latches for those bit lines. In step 526, read reference voltage Vrb is applied to the word lines associated with the page being read. In step 528, the bit lines are sensed as described above. In step 530, the results are stored in the appropriate latches for the bit lines. In step 532, read reference voltage Vrc is applied to the word lines associated with the page. In step 534, the bit lines are sensed to determine which memory cells conduct, as described above. In step 536, the results from the sensing step are stored in the appropriate latches for the bit lines. In step 538, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 212 in FIG. 6. In step 540, processor 212 will store the determined data values in the appropriate latches for each bit line. In other embodiments, sensing the various levels (Vra, Vrb, and Vrc) may occur in different orders.

Figure 17:
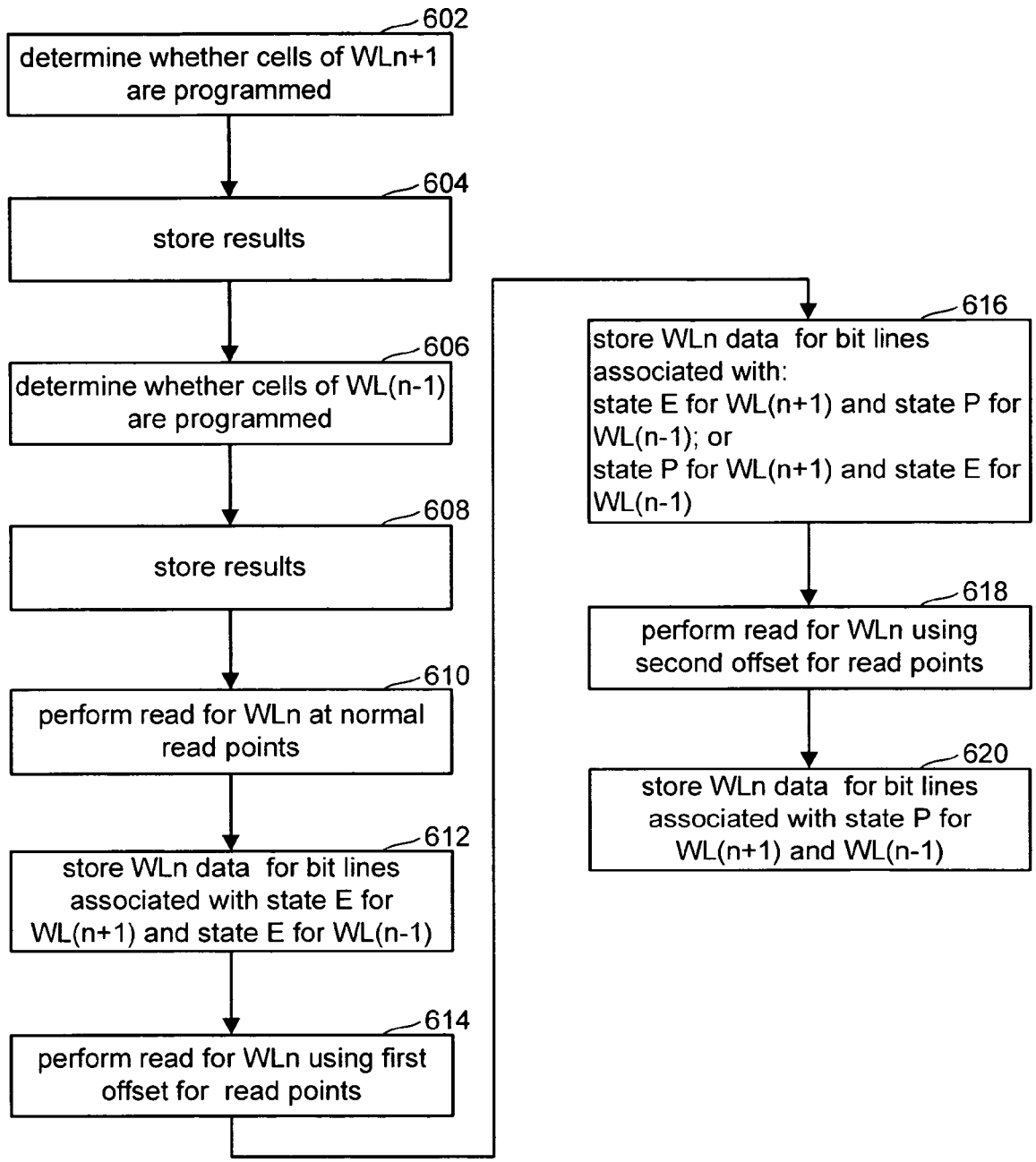
FIG. 17 is a flow chart describing one embodiment of a process for reading data programmed using full-sequence programming.

FIG. 17 is a flowchart describing a novel method for reading a page of data programmed according to the technique of FIG. 12. FIG. 17 can be used at step 510 of FIG. 15 for reading a page of data stored in memory cells coupled to an even word line other than the first word line to be programmed for the block. FIG. 17 can also be used at step 508 with a few modifications to read a page of data stored in memory cells coupled to the first word line to be programmed for the block. The modifications are noted below.

The process of FIG. 17 attempts to read the data while compensating for the floating gate to floating gate coupling effect from adjacent memory cells. The compensation includes looking at the adjacent word lines (WLn+1 and WLn−1) and determining to what degree the past programming of the adjacent word lines have created a floating gate to floating gate coupling effect. When performed for the first word line to be programmed for the block, the compensation only looks at the adjacent word line WLn+1 since there is no word line WLn−1 programmed subsequent to this first word line. If the data on word line WLn+1 and/or WLn−1 has disturbed the data on WLn via the coupling effect, then the read process will compensate for that disturb by using one or more offsets to the read reference voltages (compare points) as a function of the programmed status of the memory cell on the adjacent word line(s). FIG. 17 is simplified process that only considers whether the adjacent memory cell(s) are programmed or not. It does not determine the actual programmed state of the adjacent memory cell(s), only whether or not it is or they are programmed.

FIG. 17 describes a method for reading memory cells that had been programmed using full sequence programming (e.g., as shown in FIG. 9) where two bits of one logical page are stored in each cell and are to be read and reported out together. If the memory cell on WLn+1 is not programmed (erased state E) and the memory cell on WLn−1 is not programmed (state E), there will be no floating gate to floating gate coupling impact. If the memory cells on word lines WL(n+1) and WL(n−1) are both programmed (programmed state A, B, or C), there is a fairly large coupling impact. If the memory cell of one adjacent word line is programmed while one is erased, there will tend to be a reduced coupling impact. For the first word line to be programmed, there will either be no coupling impact or the reduced coupling impact since this word line only has a subsequently programmed word line WLn+1 and no subsequently programmed word line WLn−1. The exact coupling impacts due to the adjacent cell(s) vary by array implementation and operation and can be determined by characterizing the device.

At step 602 it is determined whether the memory cells of the first word line adjacent to the word line of interest are programmed or not. Step 602 can include the performance of a simple binary read operation for word line WLn+1. For example, step 602 can include performing steps 520-522 of FIG. 16 using the read reference voltage Vra. Those cells of word line WLn+1 that conduct under application of Vra are determined to be erased while those that do not conduct are determined to be programmed. In one embodiment, Vrb or Vrc could be used instead of Vra with the determination proceeding in the same manner. The results of step 602 are stored in the appropriate latches at step 604. At steps 606 and 608, the same operations are performed for word line WLn−1. If FIG. 17 is being performed for the first word line to be programmed (step 508 of FIG. 15), then steps 606 and 608 are skipped.

At step 610, a read operation is performed for the word line of interest WLn at the normal read compare points. This includes performing the process of FIG. 16 using Vra, Vrb, and Vrc. In some embodiments, the levels and/or the number of levels used to read WLn+1 and/or WLn−1 may not be exactly the same as those used initially to read WLn. The results of step 610 are stored at step 612 in the appropriate latches for bit lines having a memory cell on WLn with adjacent cells on both WLn+1 and WLn−1 that were determined (at steps 602 and 606) to be in state E. For other bit lines, the data is disregarded. If FIG. 17 is being performed for the first word line to be programmed (step 508), the results of step 610 are stored in the appropriate latches for bit lines with memory cells where the adjacent cell on WL(n+1) was determined to be in state E at step 602.

At step 614, a read operation will be performed for the word line of interest, WLn, using a first set of offsets for the read points, for example, offsets of 0.08V for each read point. That is, the process of FIG. 16 will be performed; however, rather than using Vra, Vrb, and Vrc, the system in this example will use Vra+0.08V, Vrb+0.08V, and Vrc+0.08V. Note, an offset value of 0.08V is exemplary only and other implementations may use different offset values. Additionally, although the offset set includes the same offset value for each state or read compare point, other embodiments, may use different offset values for different states. At step 616, the results of step 614 are stored for bit lines having a memory cell on WLn with one adjacent memory cell (e.g., WLn+1) in a programmed state and one adjacent memory cell (e.g., WLn−1) in an erased state. Data for other bit lines is disregarded. If the word line of interest is the first word line to be programmed for the block (step 508), the results of step 614 are stored for bit lines having a memory cell on WLn with an adjacent memory cell of word line WLn+1 in a programmed state since there is no subsequently programmed word line WLn−1.

At step 618, a read operation will be performed for the word line of interest WLn using a second set of offsets, for example, offsets of 0.16V for each read point. The process of FIG. 16 will be performed; however, the read reference points in this example will be Vra+0.16V, Vrb+0.16V, and Vrc+0.16V. Note that other offset values can be used. Since the floating gate to floating gate coupling effect will approximately be doubled due to two programmed neighbors, a value of about twice that used for the first offset is now used. At step 620, the results of step 618 are stored in the appropriate latches for those bit lines having a memory cell on WLn with adjacent memory cells on both word lines WLn+1 and WLn−1 in a programmed state. Data for other bit lines is disregarded. Steps 618 and 620 are not performed when FIG. 17 is performed for the first word line of the set to be programmed.

For further refinement, full read operations, rather than the simple binary read of FIG. 17, can be performed for word lines WLn+1 and WLn−1 when reading a word line of interest WLn. FIGS. 18A and 18B depict tables illustrating the combined coupling effects (FIG. 18A) of the two adjacent memory cells on a memory cell of interest and offset values (FIG. 18B) that can be used for the various couplings. In FIG. 18A, the four possible states for word line WLn+1 and word line WLn−1 are shown with exemplary coupling impacts (apparent threshold voltage shifts in millivolts) that may be expected for each combination. A memory cell that is not subsequently programmed (state E) will provide no coupling effect (0V), a memory cell programmed to state A will provide a coupling impact or effect of about 50 mV, a memory cell programmed to state B will provide a coupling impact of about 75 mV, and a memory cell programmed to state C will provide a coupling impact of about 100 mV. The combination of two adjacent memory cells having these potential coupling impacts provides 8 possible different coupling combinations. For example, if a memory cell of word line WL(n+1) is programmed to state B and a memory cell of word line WL(n−1) is programmed to state C, the combined coupling impact on a memory cell of WLn that shares the same bit line will be about 175 mV. To fully and most accurately account for the eight different coupling impact scenarios and perturbation possibilities in this example, 8 offset sets could be applied during 8 sub-reads of the word line of interest after reading both adjacent word lines.

To simplify reading of the word line of interest, however, average offset values can be used to reduce the number of required sub-reads. FIG. 18B provides one such example. The number of offset sets has been reduced to four, rather than the full eight. For combined couplings of 0 mV (both adjacent cells in state E-state E/E), a 0 mV offset value for the first set could be used. For combined couplings of 50 mV, 75 mV, or 100 mV (combined states A/E, B/E, C/E, E/A, E/B, E/C and A/A), an average offset value of 75 mV can be used. For combined couplings of 125 mV and 150 mV (combined states B/A, C/A, A/B, A/C, and B/B), an average offset value of 138 mV can be used. For combined couplings of 175 mV and 200 mV (combined states C/B, B/C and C/C), an average offset value of 188 mV can be used. Numerous variations can be used in accordance with embodiments. The combined couplings could be simplified to more or less than four combinations and different offset values used. Moreover, in embodiments having more than four states, various other combinations can be used.

Figure 19:
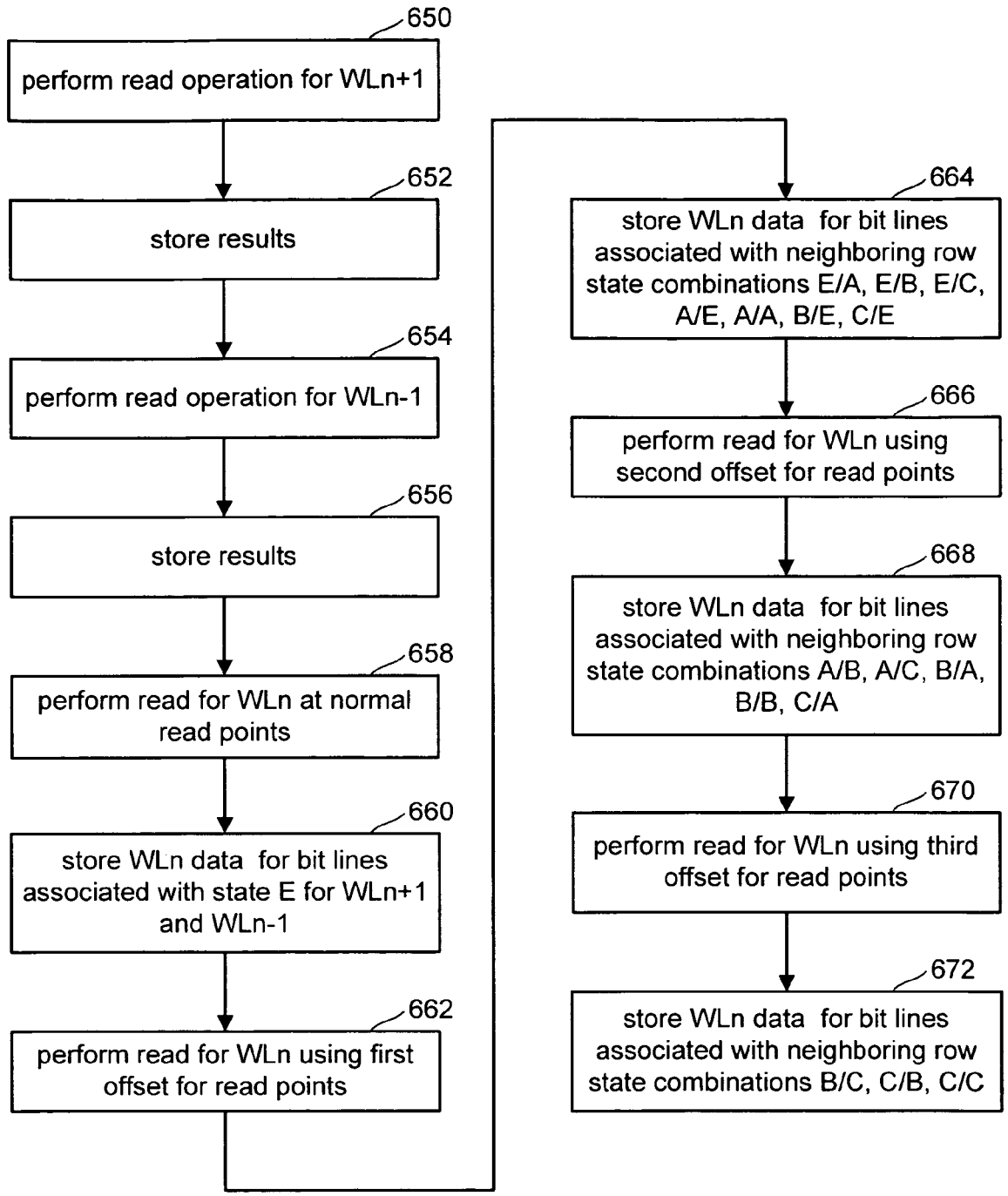
FIG. 19 is a flow chart describing one embodiment of a process for reading data programmed using full-sequence programming.

FIG. 19 describes a method for reading memory cells that were programmed using full sequence programming (e.g., as shown in FIG. 9) where full read operations are performed for adjacent word lines. FIG. 19 uses the offset sets shown in FIGS. 18A and 18B (four sub-reads), although other embodiments may use different offset sets, groupings, and numbers of sub-reads than those shown.

Step 650 includes performing a read operation for the first adjacent word line WLn+1. This can include performing the process of FIG. 16. The results of step 650 are stored in the appropriate latches at step 652. At step 654 a read operation is performed for the second adjacent word line WLn−1, which can also include performing the process of FIG. 16. The results are stored in the appropriate latches at step 656. If FIG. 19 is performed for the first word line of the block to be programmed, then steps 654 and 656 are omitted. In some embodiments, the read operations performed for word lines WLn+1 and WLn−1 result in determining the actual data stored in word lines WLn+1 and WLn−1. In other embodiments, the read operations performed for WLn+1 and WLn−1 result in a determination of charge levels on WLn+1 and WLn−1, which may or may not accurately reflect the data stored on WLn+1 and WLn−1.

At step 658, a read operation is performed for the word line of interest WLn at the normal read compare points. This can include performing the process of FIG. 16 using read compare points Vra, Vrb, and Vrc. In some embodiments, the levels and/or the number of levels used to read WLn+1 and WLn−1 may not be exactly the same as those used initially to read WLn and simply some approximation of the floating gate threshold voltage value is sufficient for WLn correction purposes. The results of step 658 are stored in the appropriate latches at step 660 for bit lines having a memory cell with the adjacent cell on word line WLn+1 and the adjacent cell on WLn−1 in state E (determined in steps 650 and 654). For other bit lines, the data is disregarded. If WLn is the first word line to be programmed for the block, then the data is stored at step 660 for bit lines having a memory cell on WLn with an adjacent cell on just WLn+1 in state E.

At step 662, a read operation is performed for the word line of interest WLn using a first set of offsets for the read points. For example, the process of FIG. 16 can be performed using Vra+0.075V, Vrb+0.075V, and Vrc+0.075V instead of just Vra, Vrb, and Vrc. The first set of offsets uses a single offset value for each state equal to 0.075V. This offset value corresponds to the average of combined couplings 50 mV, 75 mV, and 100 mV shown in FIG. 18B. Other values can be used as suited to a particular implementation. The offset set can also include a different offset value for one or more of the states. At step 664, the results of step 662 are stored for bit lines having a memory cell with adjacent cells on adjacent word lines WLn+1 and WLn−1 in any of the combinations: state E/state A; state E/state B; state E/state C; state A/state E; state A/state A; state B/state E; or state C/state E, as shown in FIGS. 18A and 18B. For the other bit lines, the data can be disregarded.

If FIG. 19 is performed for the first word line to be programmed, step 662 can include the use of a 0.05V offset value corresponding to a single adjacent cell in state A causing a 0.05V perturbation from coupling. In step 664, the data can be stored for bit lines having a memory cell on WLn with an adjacent cell on word line WLn+1 in state A. For the other bit lines, the data can be disregarded.

At step 666, a read operation is performed for the word line of interest WLn using a second set of offsets for the read points. For example, the process of FIG. 16 can be performed using Vra+0.138V, Vrb+0.138V, and Vrc+0.138V instead of just Vra, Vrb, and Vrc. The second set of offsets uses a single offset value for each state equal to 0.138V. This offset value corresponds to the average of combined couplings 125 mV 150 mV shown in FIG. 18B. Other values can be used as suited to a particular implementation. The offset set can also include a different offset value for one or more of the states. At step 668, the results of step 666 are stored for bit lines having a memory cell on WLn with adjacent cells on adjacent word lines WLn+1 and WLn−1 in any of the combinations: state A/state B; state A/state C; state B/state A; state B/state B; or state C/state A as shown in FIGS. 18A and 18B. For the other bit lines, the data can be disregarded.

If FIG. 19 is performed for the first word line to be programmed, step 666 can include the use of a 0.075V offset value corresponding to a single adjacent cell in state B causing a 0.075V perturbation from coupling. In step 668, the data can be stored for bit lines having a memory cell on WLn with an adjacent cell on word line WLn+1 in state B. For the other bit lines, the data can be disregarded.

At step 670, a read operation is performed for the word line of interest WLn using a third set of offsets for the read points. For example, the process of FIG. 22 can be performed using Vra+0.188V, Vrb+0.188V, and Vrc+0.188V instead of just Vra, Vrb, and Vrc. The third set of offsets uses a single offset value for each state equal to 0.188V. This offset value corresponds to the average of combined couplings 175 mV and 200 mV shown in FIG. 18B. Other values can be used as suited to a particular implementation. The offset set can also include a different offset value for one or more of the states. At step 672, the results of step 670 are stored for bit lines having a memory cell on WLn with adjacent cells on adjacent word lines WLn+1 and WLn−1 in any of the combinations: state B/state C; state C/state B; or state C/state C, as shown in FIGS. 18A and 18B. For the other bit lines, the data can be disregarded.

If FIG. 19 is performed for the first word line to be programmed, step 670 can include the use of a 0.10V offset value corresponding to a single adjacent cell in state C causing a 0.10V perturbation from coupling. In step 672, the data can be stored for bit lines having a memory cell on WLn with an adjacent cell on word line WLn+1 in state C. For the other bit lines, the data can be disregarded.

As previously discussed, different combinations and numbers of sub-reads for the word line of interest can be used in other embodiments. For example, eight offset sets using offset values of 0V, 50 mV, 75 mV, 100 mV, 125 mV, 150 mV, 175 mV and 200 mV could be used with eight sub-reads of the word line of interest to directly compensate for each possible coupling value. Other combinations than those used in FIG. 19 can also be used.

The above-described methods of FIGS. 16-19 were discussed with respect to full sequence programming storing two bits of one logical page of FIG. 9. These processes can be slightly modified when reading data that was programmed according to the two-step process of FIG. 10 storing one bit from each of two logical pages. For example, when performing the standard read operation (step 504 of FIG. 15), reading the lower page would require applying Vra and Vrc to the control gates of the memory cells and sensing at those read points to determine whether the data is in state E/C (data 1) or states A/B (data 0) for the lower page. Thus, FIG. 16 would be modified by performing only steps 520-524 and steps 532-540 for a lower page read. For performing a read of the upper page, read compare point Vrb would be used to determine whether upper page data is for state E/A (data 1) or states B/C (data 0). Therefore, for an upper page read, the process of FIG. 16 would be amended to perform only steps 526-530, 538, and 540. Additionally, when recovering data or reading data at steps 508 or 510, the process would perform the method of FIG. 20 for recovering data for a lower page and the process of FIG. 21 to recover data for an upper page.

Figure 20:
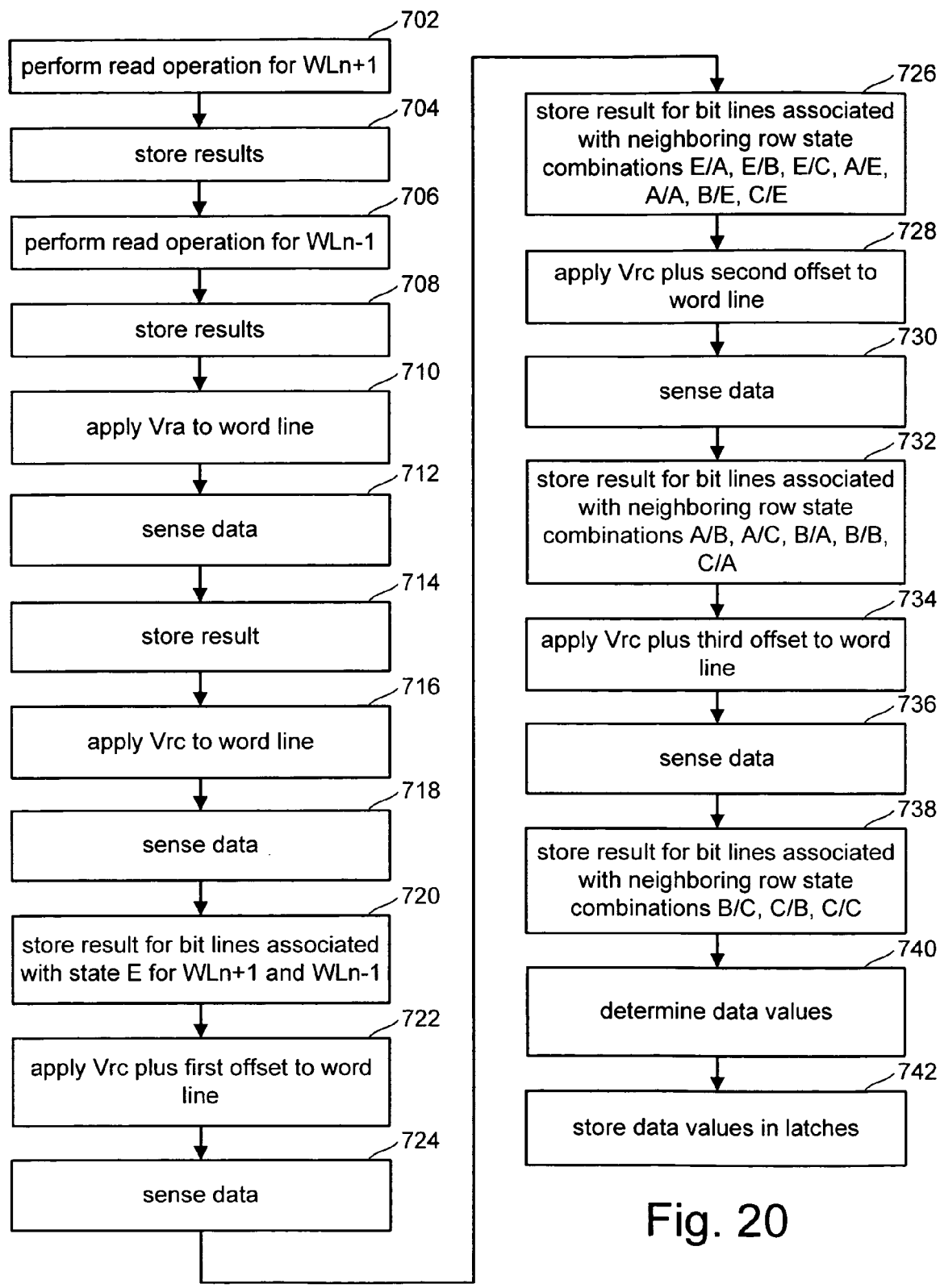
FIG. 20 is a flowchart describing one embodiment of a process for reading data from a lower page.

At step 702 of FIG. 20, a read operation is performed for the neighboring word line WLn+1 according to the method of FIG. 16 and the results stored in the appropriate latches at step 704. At step 706, a read operation is performed for the adjacent word line WLn−1 and the results stored in the appropriate latches at step 708. In some embodiments, the read operations performed for the adjacent word lines result in determining the actual data stored on WLn+1 and WLn−1. In other embodiments, the read operations for the adjacent word lines result in a determination of charge levels on WLn+1 and WLn−1, which may or may not accurately reflect the data stored therein. If FIG. 20 is performed for the first word line to be programmed, steps 706 and 708 are omitted. At step 710, read reference voltage Vra is applied to the target word line WLn. At step 712, the data for the bit lines are sensed and the results stored in the appropriate latches at step 714. At step 716, read reference voltage Vrc is applied to the word line. At step 718, data is sensed and at step 720, the results of the sensing are stored for bit lines associated with neighboring cells on both word lines WLn+1 and WLn−1 storing data in state E. If FIG. 20 is performed for the first word line to be programmed, step 720 stores the results of sensing at step 718 for bit lines associated with a neighboring cell on word line WLn+1 storing data in state E.

Note that in the process described by FIG. 20 and as given below, offsets are only applied to Vrc to separate state B from state C. It is implicitly assumed that offsets are not needed when reading at Vra because the usually negative threshold of the erased state, though affected by WLn+1 and WLn−1, is separated sufficiently far from state A as to not need correction. While this is a practical assumption for current generation memories, it may not be true in future generation memories, and the offset processes described with respect to Vrc in steps 722-738 may be added to Vra before step 714.

At step 722, Vrc plus a first offset (e.g., 0.075V or another suitable value) will be applied to the word line for the page being read. At step 724, the data will be sensed and the results stored at step 726 for bit lines associated with a neighboring cell on word line WLn+1 and a neighboring cell on WLn−1 storing data in one of the combinations: state E/state A; state E/state B; state E/state C; state A/state E; state A/state A; state B/state E; or state C/state E. Data for other bit lines will be disregarded. If steps 722 and 724 are performed for the first word line to be programmed, a typical first offset value may be about 0.05V and the results stored at step 724 for bit lines associated with a neighboring cell on word line WLn+1 storing data in state A.

At step 728, Vrc plus a second offset (e.g., 0.138V or other suitable value) will be applied to the word line associated with the page being read. At step 730, data will be sensed and the results stored at step 732 for bit lines associated with a neighboring cell on word line WLn+1 and a neighboring cell on word line WLn−1 storing data in one of the combinations: state A/state B; state A/state C; state B/state A; state B/state B; or state C/state A. If steps 728-732 are performed for the first word line to be programmed, a second offset value of 0.075V or other suitable value may be used and the results stored for bit lines having a neighboring cell on word line WLn+1 storing data in state B.

At step 734, Vrc plus a third offset (0.188V or other suitable value) will be applied to the word line associated with the page being read. At step 736, the sense module will be used to sense the data and at step 738, the results of step 736 will be stored for those bit lines associated with a neighboring cell on word line WLn+1 and a neighboring cell on word line WLn−1 storing data in one of the combinations: state B/state C; state C/state B; or state C/state C. If steps 734-738 are performed for the first word line to be programmed, an third offset value of 0.1V may be used and the results stored for bit lines having a neighboring cell on WLn+1 storing data in state C.

At step 740, processor 212 will determine the data values based on the data stored from the sensing steps. At step 742, the determined data values from step 740 will be stored in latches for eventual communication to the user requesting the read data. In another embodiment, steps 710-714 associated with state A could be performed between steps 738 and 740.

When determining the data values in step 740, if a memory cell conducts in response to Vra, the lower page data is "1." If the memory cell does not conduct in response to Vra and does not conduct in response to Vrc (or Vrc plus the appropriate offset), then the lower page data is also "1." If the memory cell does not conduct in response to Vra, but does conduct in response to Vrc (or Vrc plus the appropriate offset), then the lower page data is "0."

Figure 21:
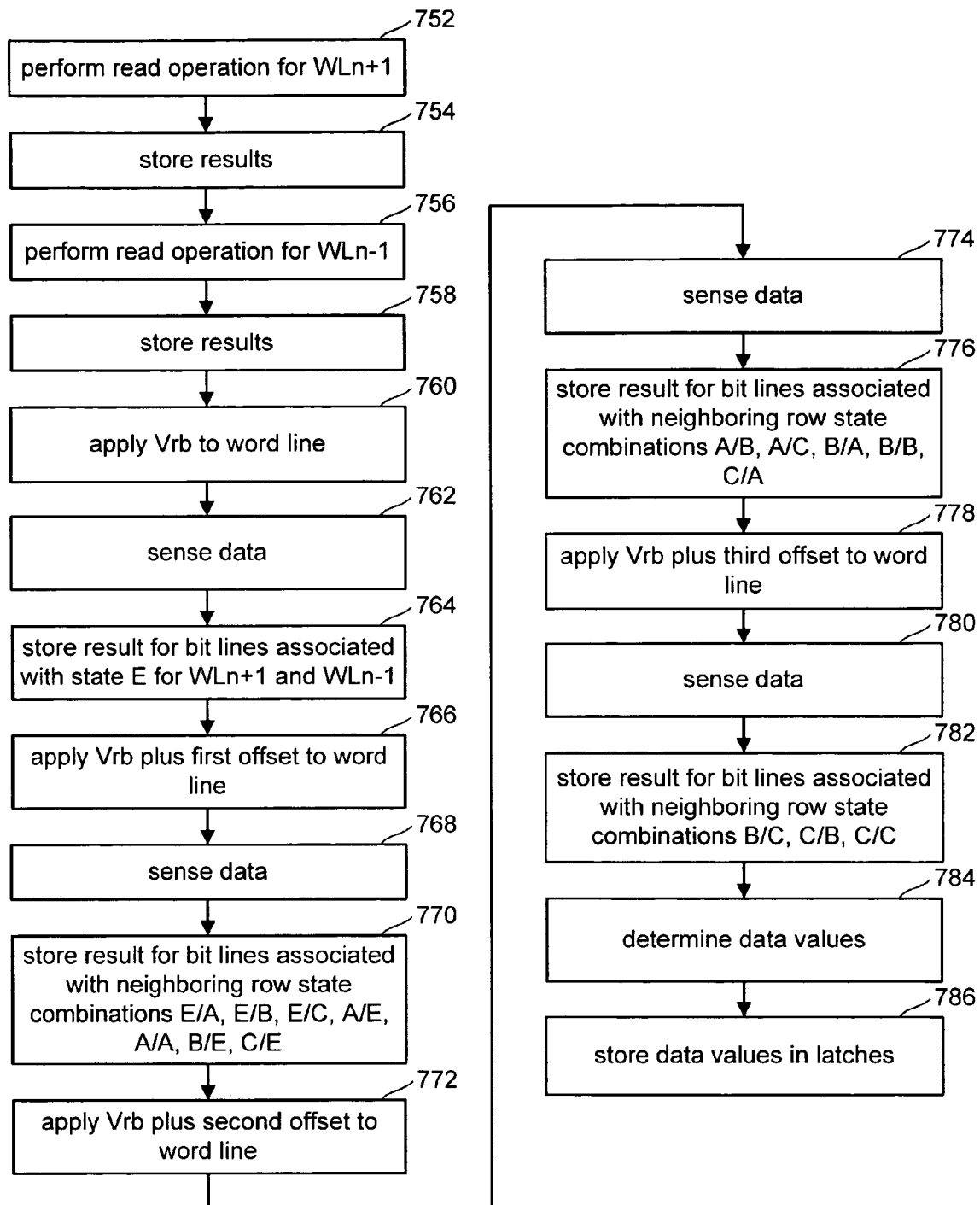
FIG. 21 is a flow chart describing one embodiment of a process of reading data from an upper page.

The process of FIG. 21 is used to read or recover data for the upper page. At step 752, a read operation is performed for the neighboring word line WLn+1 using the method of FIG. 16. At step 754, the results of step 752 are stored in the appropriate latches for each of the bit lines. At step 756, a read operation is performed for the neighboring word line WLn−1 using the method of FIG. 16 and the results stored at step 758. In some embodiments, the read operations for WLn+1 and WLn−1 result in determining the actual data stored on WLn+1 and WLn−1. In other embodiments, the read operations result in a determination of charge levels on WLn+1 and WLn−1, which may or may not accurately reflect the data stored on WLn+1 and WLn−1. If FIG. 21 is performed for the first word line to be programmed, steps 756-758 are omitted.

At step 760, read reference voltage Vrb is applied to the word line associated with the page being read. At step 762, sense modules are used to sense the data, and at step 764, the results of step 762 are stored for those bit lines associated with a neighboring memory cell on WLn+1 and a neighboring memory cell on WLn−1 storing data in state E. If steps 760-764 are performed for the first word line to be programmed, the results are stored for those bit lines associated with a neighboring memory cell on WLn+1 storing data in state E.

At step 766, Vrb plus a first offset (e.g., 0.075V or some other suitable value) is applied to the word line. At step 768, data is sensed and the results stored at step 770 for those bit lines associated with a neighboring cell on WLn+1 and a neighboring cell on WLn−1 storing data in one of the combinations: state E/state A; state E/state B; state E/state C; state A/state E; state A/state A; state B/state E; or state C/state E. If steps 766-770 are performed for the first word line to be programmed, a first offset value of 0.05V or some other suitable value could be applied and the results stored for those bit lines associated with a neighboring memory cell on WLn+1 storing state in state A.

At step 772, Vrb plus a second offset (e.g., 0.138V or another suitable value) is applied to the word line associated with the page being read. At step 774, data is sensed and the results stored at step 776 for those bit lines associated with a neighboring cell on WLn+1 and a neighboring cell on WLn−1 storing data in one of the combinations: state A/state B; state A/state C; state B/state A; state B/state B; or state C/state A. If steps 772-776 are performed for the first word line to be programmed, a second offset value of 0.075V or another suitable value can be applied and the results of sensing stored for those bit lines having a neighboring cell on WLn+1 storing data in state B.

At step 778, Vrb plus a third offset (0.188V or another suitable value) is applied to the word line associated with the page being read. At step 780, data is sensed and the results stored at step 782 for those bit lines associated with a neighboring memory cell on WLn+1 and a neighboring cell on WLn−1 storing data in one of the combinations: state B/state C; state C/state B; or state C/state C. If steps 778-782 are performed for the first word line to be programmed, a third offset value of 0.10V could be applied and the results stored for those bit lines associated with a neighboring memory cell on WLn+1 storing data in state C.

At step 784, processor 212 of FIG. 6 determines the data values based on the stored sensed data. If a memory cell turned on in response to Vrb (or Vrb plus the appropriate offset), then the upper page data is "1." If a memory cell does not turn on in response to Vrb (or Vrb plus the appropriate offset), then the upper page data is "0." At step 786, the data values determined by processor 212 are stored in the data latches for communication to the user.

The methods of FIGS. 20 and 21 can be used to recover data at step 416 of FIG. 14 as well as to perform initial data reads at step 404 (steps 508 or 510 of FIG. 15). FIGS. 20 and 21 are for reading data that are programmed using the upper page and lower page process of FIG. 10. These two methods of FIGS. 20 and 21 can be used to read data programmed by all bit line programming or odd/even bit line programming. When used with all bit line programming, all bit lines are read simultaneously. When used with odd/even bit line programming, even bit lines are read simultaneously at a first time and odd bit lines are read simultaneously at a different time.

Figure 22:
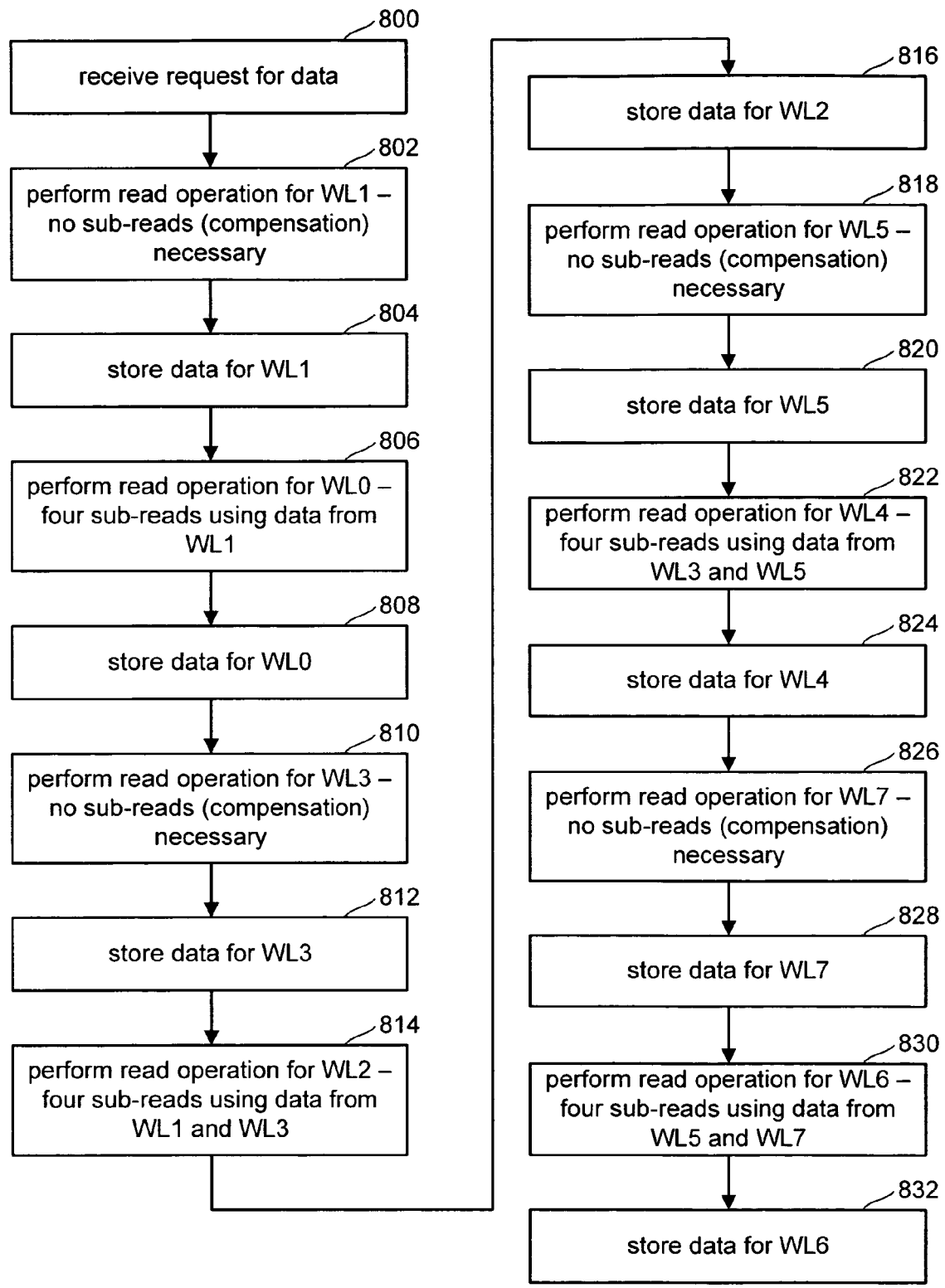
FIG. 22 is flowchart describing one embodiment of a process of reading data from multiple word lines.

FIGS. 16-21 describe reading data from a single word line in response to a request for a page of data from that word line. FIG. 22 depicts an embodiment where each row of a block is read in response to a request to read any row within that block. This novel technique can provide performance benefits by efficiently obtaining the data of neighboring rows before it is needed for a selected row and caching such data in anticipation that it is likely to be requested as well since most requests will involve multiple pages of data within a block.

In response to a read request received at step 800 that involves one or more word lines within a block of cells, a read operation is performed for word line WL1 at step 802. WL1 is an odd word line, and thus, no compensation or offsets are necessary when performing the read operation. The process of FIG. 16 can be used to read WL1. At step 804, data for word line WL1 is stored. In one embodiment, the results of the sensing operation for WL1 are used by processor 212 of FIG. 6 to determine data values that are then stored or buffered in data latches 214. Since data may be stored for many word lines before it is read out to the host or user, many latches may be required to buffer this data. In other embodiments, memory may be maintained within control circuitry 120, controller 144 of FIG. 5, or external to the memory device itself to buffer the extra data.

At step 806, a read operation is performed for word line WL0. Reading the data from WL0 includes applying compensations based on the data stored in word line WL1 which was determined at step 802. The modified forms of FIGS. 19-21 described above for the first word line to be programmed can be used to read word line WL0. Accordingly, four sub-reads using the original set of read compare points and 3 adjusted sets based on the offset values in 3 offset sets can be used. At step 808, the results from the appropriate read process are stored for each bit line based on the information determined for the adjacent memory cell on word line WL1 for that bit line.

At step 810, a read operation is performed for WL3 using the process of FIG. 16. The data for WL3 is stored at step 812. At step 814, a read operation is performed for word line WL2. The read operation for word line WL2 can be performed using the processes of FIG. 19-21 where WL1 is WLn−1 and WL3 is WLn+1. For each bit line, the state of an adjacent memory cell on WL1 and an adjacent memory cell on WL3 can be used to select the results from the appropriate sub-read to be stored at step 816. At step 818, a read operation is performed for WL5 using the process of FIG. 16. The data for WL5 is stored at step 820. At step 822, a read operation for WL4 is performed using the process of FIG. 19 or the processes of FIGS. 20-21 where WL3 is WLn−1 and WL5 is WLn+1. For each bit line, the state of an adjacent memory cell on WL3 and the state of an adjacent memory cell on WL5 can be used to select the results from the appropriate sub-read to be stored at step 824. At step 826, a read operation is performed for word line WL7 using the process of FIG. 16. The data for WL7 is stored at step 828. At step 830 a read operation is performed for WL6 using the process of FIG. 19 or the processes of FIG. 20-21 where WL5 is WLn−1 and WL7 is WLn+1. For each bit line, the state of an adjacent memory cell on WL5 and the state of an adjacent memory cell on WL7 can be used to elect the results from the appropriate sub-read to be stored at step 832.

In one embodiment, a memory array implementing the programming processes of FIGS. 17 and 19-21 will reserve a set of memory cells to store one or more flags. For example, one column of memory cells can be used to store flags indicating whether the lower page of the respective rows of memory cells has been programmed and another column of memory cells can be used to store flags indicating whether the upper page for the respective rows of memory cells has been programmed. In some embodiments, redundant cells can be used to store copies of the flag. By checking the appropriate flag, it can be determined whether various pages for the neighboring word line have been programmed. More details about such flags and the process for programming can be found in U.S. Pat. No. 6,657,891, Shibata et al., "Semiconductor Memory Device For Storing Multi-Valued Data," incorporated herein by reference in its entirety.

A flag can be checked for WLn+1 and WLn−1 prior to beginning the processes of the flowcharts in FIGS. 17 and 19-21. If the flags indicate that neither word line has undergone programming subsequent to WLn being programmed, then the read operation for WLn can be performed using the normal read points as shown in FIG. 16. Since it is known that there is no floating gate to floating gate coupling due to subsequently programmed memory cells on WLn+1 and WLn−1, the sub-reads using various offsets are not necessary. If the flags indicate that one adjacent word line has been programmed and one has not, the process of the flowcharts can be performed to compensate for coupling from the one subsequently programmed word line. The process can be performed substantially as previously described for the first word line that is programmed for the set. In this case, however, the compensations may be based on WLn−1 instead of WLn+1, depending on which word line is indicated by the flags to have been programmed. For more information on compensation schemes where only one adjacent word line is programmed subsequent to the word line of interest, see U.S. patent application Ser. No. 11/099,133, entitled "COMPENSATING FOR COUPLING DURING READ OPERATIONS OF NON-VOLATILE MEMORY," filed Apr. 5, 2005, incorporated by reference in its entirety.

As a result of the ability to reverse the writing sequence effects of the floating gate to floating gate coupling, the margins between threshold voltage distributions can be made smaller or the memory system can be programmed faster.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a first set of non-volatile storage elements coupled to a first word line adjacent to a select gate line;
   a second set of non-volatile storage elements coupled to a second word line adjacent to said first word line; and
   a third set of non-volatile storage elements coupled to a third word line adjacent to said second word line, programming of non-volatile storage elements coupled to said second word line begins after programming non-volatile storage elements coupled to said third word line begins and after programming non-volatile storage elements coupled to said first word line begins.

2. The non-volatile memory system of claim 1, wherein:
   said select gate line is a source side select gate line.

3. The non-volatile memory system of claim 1, wherein:
   said first set of non-volatile storage elements stores a first page of data.

4. The non-volatile memory system of claim 1, wherein:
   said first set of non-volatile storage elements storage a first page of data and a second page of data.

5. The non-volatile memory system of claim 1, further comprising:
   managing circuitry in communication with said first set of non-volatile storage elements, said second set of non-volatile storage elements, said third set of non-volatile storage elements, and a fourth set of non-volatile storage elements coupled to a fourth word line adjacent to said third word line, said managing circuitry responds to a request to read data from said third set of non-volatile storage elements by:
      for each non-volatile storage element of at least a subset of said third set of non-volatile storage elements, determining an offset from a predetermined set of offsets based on a charge level stored in a first adjacent non-volatile storage element coupled to said second word line and a charge level stored in a second adjacent non-volatile storage element coupled to said fourth word line, and
      performing a set of read processes for said non-volatile storage elements coupled to said third word line, each read process of said set uses a different one of said offsets from said predetermined set of offsets and is performed on all of said non-volatile storage elements coupled to said third word line, each non-volatile storage element coupled to said third word line provides final data from an appropriate one of said read processes associated with said offset determined for said each non-volatile storage element.

6. The non-volatile memory system of claim 5, wherein said determining an offset from a predetermined set of offsets includes:
   reading said first adjacent non-volatile storage element;
   reading said second adjacent non-volatile storage element storage element; and
   correlating information from said reading of said first adjacent non-volatile storage element and said reading of said second adjacent non-volatile storage element with said predetermined set of offsets.

7. The non-volatile memory system of claim 6, wherein said performing said set of read processes includes:
   performing a first read process using a first offset and storing results for one or more non-volatile storage elements of said second set having:
      a first adjacent non-volatile storage element in a first state and a second adjacent non-volatile storage element in a second state, a third state, or a fourth state,
      a first adjacent non-volatile storage element in said second state and a second adjacent non-volatile storage element in said first state or said second state, or
      a first adjacent non-volatile storage element in said third state or said fourth state and a second adjacent non-volatile storage element in said first state;
   performing a second read process using a second offset and storing results for one or more non-volatile storage elements of said second set having:
      a first adjacent non-volatile storage element in said second state and a second adjacent non-volatile storage element in said third state or said fourth state,
      a first adjacent non-volatile storage element in said third state and a second adjacent non-volatile storage element in second state or said third state, or
      a first adjacent non-volatile storage element in said fourth state and a second adjacent non-volatile storage element in said second state; and
   performing a third read process using a third offset and storing results for one or more non-volatile storage elements of said second set having:
      a first adjacent non-volatile storage element in said third state and a second adjacent non-volatile storage element in said fourth state, or
      a first adjacent non-volatile storage element in said fourth state and a second adjacent non-volatile storage element in said third state or said fourth state.

8. The non-volatile memory system of claim 1, wherein:
   programming non-volatile storage elements coupled to said first word line begins prior to programming non-volatile storage elements coupled to said third word line.

9. The non-volatile memory system of claim 1, wherein:
   non-volatile storage elements of said first set, said second set, and said third set are coupled to consecutive bit lines.

10. The non-volatile memory system of claim 1, wherein:
    non-volatile storage elements of said first set, said second set, and said third set are coupled to every other bit line of a group of bit lines.

11. The non-volatile memory system of claim 1, wherein:
    non-volatile storage elements of said first set, said second set, and said third set are flash memory devices.

12. The non-volatile memory system of claim 1, wherein:
    non-volatile storage elements of said first set, said second set, and said third set are NAND flash memory devices.

13. The non-volatile memory system of claim 1, wherein:
    non-volatile storage elements of said first set, said second set, and said third set are multi-state flash memory devices.

14. The non-volatile memory system of claim 1, wherein:
    non-volatile storage elements of said first set, said second set, and said third set include floating gates.

15. The non-volatile memory system of claim 1, wherein:
    non-volatile storage elements of said first set, said second set, and said third set each include a dielectric region for storing charge.

16. A non-volatile memory system, comprising:
    a set of non-volatile storage elements;
    a plurality of word lines in communication with said set of non-volatiles storage elements; and
    managing circuitry in communication with said set of non-volatile storage elements and said plurality of word lines, said managing circuitry programs said set of non-volatile storage elements by:

programming non-volatile storage elements coupled to a first word line, said first word line is adjacent to a select gate line for said set of non-volatile storage elements, programming non-volatile storage elements coupled to a third word line, said third word line is adjacent to a second word line, said second word line is adjacent to said first word line, programming non-volatile storage elements coupled to said second word line subsequent to programming non-volatile storage elements coupled to said third word line and non-volatile storage elements coupled to said first word line, wherein programming non-volatile storage elements coupled to said second word line begins after programming non-volatile storage elements coupled to said third word line begins;

programming non-volatile storage elements coupled to a fourth word line subsequent to programming non-volatile storage elements coupled to said second word line, said fourth word line is adjacent to said third word line;

wherein said managing circuitry responds to a request including a request to read data from said third word line by:

for each non-volatile storage element of at least a subset of said non-volatile storage elements coupled to said third word line, determining an offset from a predetermined set of offsets based on a charge level stored in a first adjacent non-volatile storage element coupled to said second word line and a charge level stored in a second adjacent non-volatile storage element coupled to said fourth word line; and performing a set of read processes for said non-volatile storage elements coupled to said third word line, each read process of said set uses a different one of said offsets from said predetermined set of offsets and is performed on all of said non-volatile storage elements coupled to said third word line, there is at least one read process for each offset, each non-volatile storage element coupled to said third word line provides final data from an appropriate one of said read processes associated with said offset determined for said each non-volatile storage element based on said charge level stored in said first adjacent non-volatile storage element and said charge level stored in said second adjacent non-volatile storage element.

17. A non-volatile memory system, comprising:

a set of non-volatile storage elements;

managing circuitry in communication with said set of non-volatile storage elements, said managing circuitry reads said set of non-volatile storage elements by, for each non-volatile storage element of at least a subset of said set of non-volatile storage elements, determining an offset from a predetermined set of offsets based on a charge level stored in a first adjacent non-volatile storage element and a charge level stored in a second adjacent non-volatile storage element, said first and second adjacent non-volatile storage elements are programmed subsequent to said each non-volatile storage element and are coupled to a same bit line, said managing circuitry performs a set of read processes for said set of non-volatile storage elements, each read process of said set uses a different one of said offsets from said predetermined set of offsets and is performed on all of said set of non-volatile storage elements, each non-volatile storage element of said subset provides final data from an appropriate one of said read processes associated with said offset determined for said each non-volatile storage element.

18. The non-volatile memory system of claim 17, wherein:

said set of non-volatile storage elements stores a first page of data;

said set of non-volatile storage elements is connected to a first word line;

said first adjacent non-volatile storage element is connected to a second word line adjacent to said first word line; and said second non-volatile storage element is connected to a third word line adjacent to said first word line.

19. The non-volatile memory system of claim 17, wherein:

said set of non-volatile storage elements storage a first page of data and a second page of data; and said set of non-volatile storage elements is connected to a first word line;

said first adjacent non-volatile storage element is connected to a second word line adjacent to said first word line; and said second non-volatile storage element is connected to a third word line adjacent to said first word line.

20. The non-volatile memory system of claim 17, wherein said determining an offset from a predetermined set of offsets includes:

reading said first adjacent non-volatile storage element;

reading said second adjacent non-volatile storage element storage element; and correlating information from said reading of said first adjacent non-volatile storage element and said reading of said second adjacent non-volatile storage element with said predetermined set of offsets.

21. The non-volatile memory system of claim 20, wherein said performing said set of read processes includes:

performing a first read process using a first offset and storing results for one or more non-volatile storage elements having:

a first adjacent non-volatile storage element in a first state and a second adjacent non-volatile storage element in a second state, a third state, or a fourth state, or a first adjacent non-volatile storage element in said second state and a second adjacent non-volatile storage element in said first state or said second state, or a first adjacent non-volatile storage element in said third state or said fourth state and a second adjacent non-volatile storage element in said first state;

performing a second read process using a second offset and storing results for one or more non-volatile storage elements having:

a first adjacent non-volatile storage element in said second state and a second adjacent non-volatile storage element in said third state or said fourth state, a first adjacent non-volatile storage element in said third state and a second adjacent non-volatile storage element in said second state or said third state, or a first adjacent non-volatile storage element in said fourth state and a second adjacent non-volatile storage element in said second state; and performing a third read process using a third offset and storing results for one or more non-volatile storage elements having:

a first adjacent non-volatile storage element in said third state and a second adjacent non-volatile storage element in said fourth state, or a first adjacent non-volatile storage element in said fourth state and a second adjacent non-volatile storage element in said third state or said fourth state.

22. The non-volatile memory system of claim 17, wherein said determining an offset from a predetermined set of offsets includes:
  determining a status of said first adjacent non-volatile storage element as programmed or erased;
  determining a status of said second adjacent non-volatile storage element as programmed or erased; and
  correlating a combination of said status of said first adjacent non-volatile storage element and said status of said second adjacent non-volatile storage element with said predetermined set of offsets.

23. The non-volatile memory system of claim 22, wherein performing said set of read processes includes:
  performing a first read process using a first offset and storing results for one or more non-volatile storage elements having a first adjacent non-volatile storage element in a programmed state and a second adjacent non-volatile storage element in an erased state; and
  performing a second read process using a second offset and storing results for one or more non-volatile storage elements having a first and second adjacent non-volatile storage element in a programmed state.

24. The non-volatile memory system of claim 17, wherein: each offset of said predetermined set of offsets includes a different offset value for at least two programmed states.

25. The non-volatile memory system of claim 17, wherein: each offset of said predetermined set of offsets includes a single offset value that is the same for each programmed state.

26. The non-volatile memory system of claim 17, wherein: said set of non-volatile storage elements is coupled to a first word line; and
  non-volatile storage elements of said set are coupled to consecutive bit lines.

27. The non-volatile memory system of claim 17, wherein: said set of non-volatile storage elements are coupled to a first word line; and
  non-volatile storage elements of said set are coupled to every other bit line of a group of bit lines.

28. The non-volatile memory system of claim 17, wherein: non-volatile storage elements of said set are NAND flash memory devices.

29. The non-volatile memory system of claim 17, wherein: non-volatile storage elements of said set are multi-state flash memory devices.

30. The non-volatile memory system of claim 17, wherein: non-volatile storage elements of said set include floating gates.

31. The non-volatile memory system of claim 17, wherein: non-volatile storage elements of said set each include a dielectric region for storing charge.

* * * * *